US009177574B2

(12) United States Patent
Fuji et al.

(10) Patent No.: US 9,177,574 B2
(45) Date of Patent: Nov. 3, 2015

(54) MAGNETO-RESISTANCE EFFECT DEVICE WITH MIXED OXIDE FUNCTION LAYER

(71) Applicant: KABUSHIKI KAISHA TOSHIBA, Tokyo (JP)

(72) Inventors: Yoshihiko Fuji, Kawasaki (JP); Hideaki Fukuzawa, Kawasaki (JP); Hiromi Yuasa, Kawasaki (JP); Michiko Hara, Yokohama (JP); Shuichi Murakami, Fuchu (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/469,484

(22) Filed: Aug. 26, 2014

(65) Prior Publication Data

US 2014/0362477 A1 Dec. 11, 2014

Related U.S. Application Data

(60) Division of application No. 14/025,194, filed on Sep. 12, 2013, now abandoned, which is a division of application No. 13/481,317, filed on May 25, 2012, now abandoned, which is a continuation of application No. PCT/JP2009/006442, filed on Nov. 27, 2009.

(51) Int. Cl.
*G11B 5/39* (2006.01)
*B82Y 25/00* (2011.01)
(Continued)

(52) U.S. Cl.
CPC . *G11B 5/39* (2013.01); *B82Y 25/00* (2013.01); *G01R 33/093* (2013.01);
(Continued)

(58) Field of Classification Search
CPC ............. G11B 5/39–5/3993; G11B 2005/3996
USPC .................................................. 360/313–328
See application file for complete search history.

(56) References Cited

U.S. PATENT DOCUMENTS 8,213,130 B1 7/2012 Fuji et al.
2002/0048128 A1* 4/2002 Kamiguchi et al. ........ 360/324.1
(Continued)

FOREIGN PATENT DOCUMENTS

JP 2003-133614 5/2003
JP 2004-006589 1/2004
(Continued)

OTHER PUBLICATIONS

International Search Report for PCT/JP2009/006442 mailed Mar. 23, 2010.
(Continued)

*Primary Examiner* — Craig A. Renner
(74) *Attorney, Agent, or Firm* — Nixon & Vanderhye P.C.

(57) ABSTRACT

According to one embodiment, a magneto-resistance effect device includes: a multilayer structure having a cap layer; a magnetization pinned layer; a magnetization free layer provided between the cap layer and the magnetization pinned layer; a spacer layer provided between the magnetization pinned layer and the magnetization free layer; a function layer which is provided in the magnetization pinned layer, between the magnetization pinned layer and the spacer layer, between the spacer layer and the magnetization free layer, in the magnetization free layer, or between the magnetization free layer and the cap layer, the function layer having oxide containing at least one element selected from Zn, In, Sn and Cd, and at least one element selected from Fe, Co and Ni; and a pair of electrodes for applying a current perpendicularly to a film plane of the multilayer structure.

8 Claims, 25 Drawing Sheets

(51) Int. Cl.
- *G01R 33/09* (2006.01)
- *H01L 43/08* (2006.01)
- *H01L 43/10* (2006.01)
- *H01L 43/12* (2006.01)
- *H01F 10/32* (2006.01)
- *H01F 41/32* (2006.01)

(52) U.S. Cl.
CPC ........... *G11B 5/3903* (2013.01); *G11B 5/3906* (2013.01); *G11B 5/398* (2013.01); *G11B 5/3983* (2013.01); *H01F 10/3259* (2013.01); *H01L 43/08* (2013.01); *H01L 43/10* (2013.01); *H01L 43/12* (2013.01); *G11B 2005/3996* (2013.01); *H01F 10/3272* (2013.01); *H01F 41/325* (2013.01)

(56) References Cited

U.S. PATENT DOCUMENTS

| | | |
|---|---|---|
| 2002/0150791 A1 | 10/2002 | Yuasa et al. |
| 2003/0016475 A1 | 1/2003 | Hoshiya et al. |
| 2003/0168673 A1 | 9/2003 | Yuasa et al. |
| 2007/0274009 A1 | 11/2007 | Hoshino et al. |
| 2008/0062577 A1 | 3/2008 | Fukuzawa et al. |
| 2008/0218912 A1 | 9/2008 | Hirata et al. |
| 2009/0039345 A1 | 2/2009 | Gustavsson |
| 2009/0190262 A1 | 7/2009 | Murakami et al. |
| 2011/0261478 A1 | 10/2011 | Takeo et al. |
| 2012/0050920 A1 | 3/2012 | Takeo et al. |
| 2012/0206837 A1 | 8/2012 | Fuji et al. |

FOREIGN PATENT DOCUMENTS

| | | |
|---|---|---|
| JP | 2004-039672 | 2/2004 |
| JP | 2006-261306 | 9/2006 |
| JP | 2008-500722 | 1/2008 |
| JP | 2008-091842 | 4/2008 |
| JP | 2009-182129 | 8/2009 |
| JP | 2009-238918 | 10/2009 |

OTHER PUBLICATIONS

U.S. Appl. No. 10/400,690, filed Mar. 28, 2003, Fukuzawa et al.

JP 2011-542990 Office Action dated Aug. 9, 2013 with English-language Translation.

* cited by examiner

FIG. 20

| | OXYGEN EXPOSURE OF IAO (Langmuir) | ρ Zn-FeCo-O (μΩcm) | RA VALUE (Ωμm²) | MR RATIO (%) |
|---|---|---|---|---|
| COMPARATIVE EXAMPLE 2 | — | — | 0.08 | 1.5 |
| COMPARATIVE EXAMPLE 3 | $3.0 \times 10^4$ | $5 \times 10^4$ | 1.08 | 0.5 |
| EXAMPLE 15 | $1.2 \times 10^4$ | $2 \times 10^3$ | 0.12 | 3 |
| EXAMPLE 16 | $1.5 \times 10^4$ | $1 \times 10^4$ | 0.28 | 3.5 |
| EXAMPLE 17 | $1.8 \times 10^4$ | $4 \times 10^4$ | 0.88 | 2.1 |

US 9,177,574 B2

MAGNETO-RESISTANCE EFFECT DEVICE WITH MIXED OXIDE FUNCTION LAYER

CROSS-REFERENCE TO RELATED APPLICATION(S)

This application is a Divisional of commonly owned U.S. application Ser. No. 14/025,194, filed Sep. 12, 2013 (now abandoned), which is a divisional of Ser. No. 13/481,317, filed May 25, 2012 (now abandoned), which is a Continuation Application of PCT Application No. PCT/JP2009/006442, filed Nov. 27, 2009, which is published under PCT Article 21(2) in Japanese, the entire contents of which are incorporated herein by reference.

FIELD

The present invention relates to a magneto-resistance effect device, and a magnetic recorder using the same.

BACKGROUND ART

A magneto-resistance effect device having a thin-film spin filter layer (SF) which is made of oxide or nitride and which is inserted in each of ferromagnetic layers or in an interface between each of the ferromagnetic layers and a nonmagnetic spacer layer has been proposed in JP-A-2004-6589. This SF layer can increase the MR (Magneto-Resistance) ratio because it has a spin filter effect in inhibiting conduction of either up-spin electrons or down-spin electrons.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

FIG. 20 is a view showing the relations among the RA value of each magneto-resistance effect device, the resistivity of each function layer and the MR ratio.

DETAILED DESCRIPTION

Figure 1:
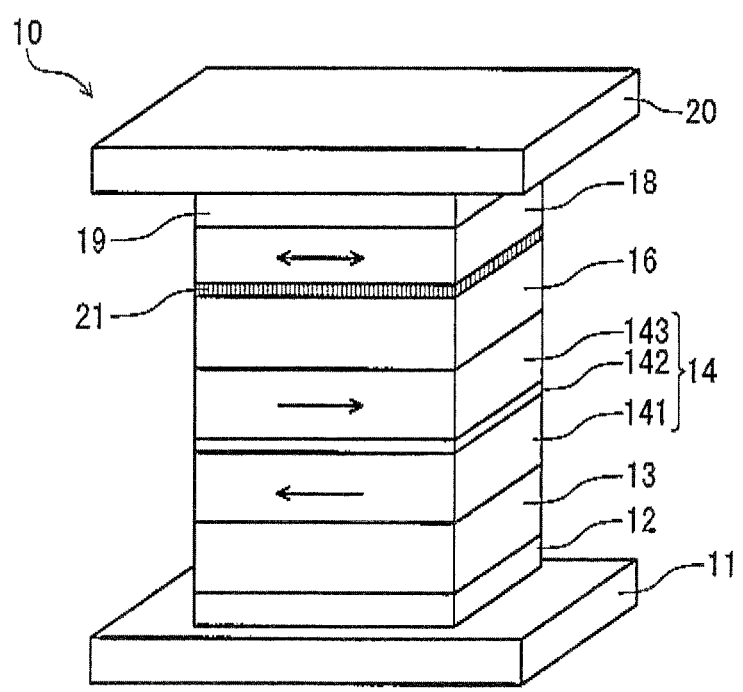
FIG. 1 is a view showing the configuration of a magneto-resistance effect device according to a first embodiment of the invention.

Embodiments of the invention will be described below with reference to the drawings. In the drawings which will be described later, parts given the same numerals represent the same parts and duplicated description thereof will be omitted.

A CPP (Current Perpendicular to Plane)-GMR device including a high-sensitive spin valve film using a giant magneto-resistance (GMR) effect is assumed in the invention. The spin valve film is a laminated film having a sandwich structure in which a nonmagnetic spacer layer is sandwiched between two ferromagnetic layers. A laminated film structure region exhibiting a resistance change is also called sin-dependent scattering unit. The magnetization direction of one (called "pin layer" or "magnetization pinned layer") of the two ferromagnetic layers is fixed by an antiferromagnetic layer or the like. The magnetization direction of the other ferromagnetic layer (called "free layer" or "magnetization free layer") can be changed by an external magnetic field. In the spin valve film, a large magneto-resistance effect can be obtained by change in relative angle between the magnetization directions of the two ferromagnetic layers. Incidentally, in the CPP-GMR device, a current is applied from a direction perpendicular to the spin valve film plane.

First Embodiment

FIG. 1 is a view showing the configuration of a magneto-resistance effect device 10 according to a first embodiment of the invention.

The magneto-resistance effect device 10 according to this embodiment has: a cap layer 19 which prevents the magneto-resistance effect device 10 from deterioration such as oxidation; a magnetization pinned layer (hereinafter referred to as pin layer) 14 in which magnetization is fixed; a magnetization free layer (hereinafter referred to as free layer) 18 which is provided between the cap layer 19 and the pin layer 14 so that magnetization rotates freely; an intermediate layer (hereinafter referred to as spacer layer) 16 which is made of a nonmagnetic substance provided between the pin layer 14 and the free layer 18; and a function layer 21 which is provided between the spacer layer 16 and the free layer 18 and which contains mixed oxide of at least one element of Zn, In, Sn and Cd and at least one element of Fe, Co and Ni. The cap layer 19, the free layer 18, the function layer 21, the spacer layer 16 and the pin layer 14 are defined collectively here as a multilayer structure.

The magneto-resistance effect device 10 further has: a pair of electrodes 11 and 20 between which a current is applied perpendicularly to a film plane of the multilayer structure a pinning layer 13 which is provided between the electrode 11 and the pin layer 14 and which is made of an antiferromagnetic substance for fixing the magnetization direction of the pin layer 14; and an undercoating layer 12 which is provided between the pinning layer 13 and the electrode 11.

The electrodes 11 and 20 are provided so that a current is applied in a direction perpendicular to a film plane of the magneto-resistance effect device 10. When a voltage is applied between the electrodes 11 and 20, a current flows into the magneto-resistance effect device 10 along the direction perpendicular to the film plane.

Because this current flows, change of resistance caused by the magneto-resistance effect can be detected so that magnetism can be detected. Cu, Au, or the like which is relatively low in electric resistance in order to apply a current to the magneto-resistance effect device 10 is used as each of the electrodes 11 and 20.

Figure 2:
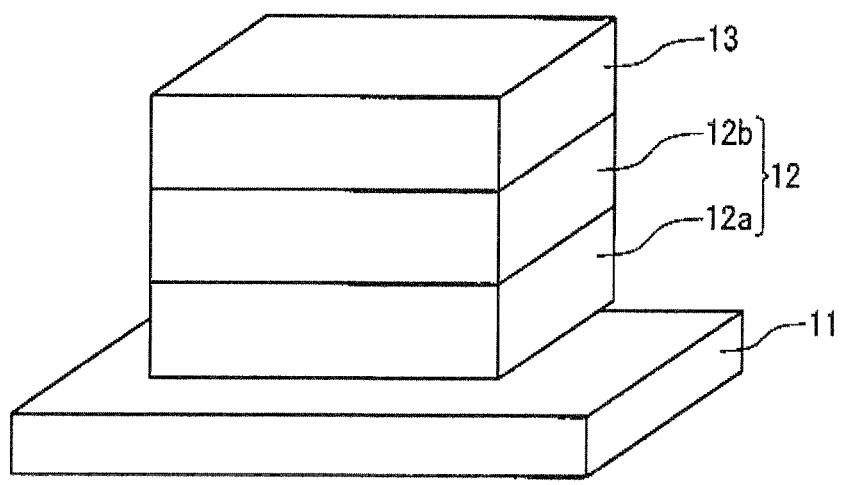
FIG. 2 is a view showing the configuration of an undercoating layer.

For example, the undercoating layer 12 is configured so that a seed layer 12b is provided on a buffer layer 12a as shown in FIG. 2.

The buffer layer 12a is a layer which relaxes surface roughness of the electrode 11 so as to make crystallinity laminated on the buffer layer 12a good. For example, Ta, Ti, V, W, Zr, Hf, Cr, or alloys thereof can be used as the buffer layer 12a. It is preferable that the film thickness of the buffer layer 12a is not smaller than 1 nm and not larger than 10 nm. It is more preferable that the film thickness of the buffer layer 12a is not smaller than 2 nm and not larger than 5 nm. If the buffer layer 12a is too thin, the buffer effect is lost. On the other hand, if the buffer layer 12a is too thick, series resistance which does not contribute to the MR ratio increases. Incidentally, when the seed layer 12b formed on the buffer layer 12a has a buffer effect, it is unnecessary to provide the buffer layer 12a. As a preferable example, 3 rum-thick Ta can be formed.

The seed layer 12b is a layer for controlling the crystal orientation and crystal gain size of a layer laminated on the seed layer 12b. A metal or the like having an fcc structure (face-centered cubic structure), an hcp structure (hexagonal close-packed structure) or a bcc structure (body-centered cubic structure) is preferred as the seed layer 12b.

For example, by using Ru having an hop structure or NiFe having an fcc structure as the seed layer 12b, the crystal orientation of the spin valve film on the seed layer 12b can be made as an fcc (111) orientation. When the pinning layer 13 is made of IrMn, a good fcc (111) orientation can be achieved. When the pinning layer 13 is made of PtMn, a regularized fct (111) structure (face-centered tetragonal structure) can be obtained. When an fcc metal is used as the free layer 18 and the pin layer 14, a good fcc (111) orientation can be achieved. When a bcc metal is used as the free layer 18 and the pin layer 14, a good bcc (110) orientation can be achieved. To give full play to the function of the seed layer 12b to improve the crystal orientation, the film thickness of the seed layer 12b is set preferably to be not smaller than 1 nm and not larger than 5 nm, and more preferably to be not smaller than 1.5 nm and not larger than 3 nm. As a preferable example, 2 nm-thick Ru can be formed.

Besides Ru, an NiFe-base alloy (such as $Ni_xFe_{100-x}$ (x=90% to 50%, preferably, 75% to 85%) or $(Ni_xFe_{100-x})_{100-y}X_y$ (X=Cr, V, Nb, Hf, Zr, Mo) obtained by adding a third element X to NiFe to nonmagnetize NiFe) may be used as the seed layer 12b. The NiFe-base seed layer 12b is relatively easy to obtain a good crystal orientation so that the half-value width of a rocking curve can be set to be 3° to 5°. The seed layer 12b has not only the function of improving the crystal orientation but also a function of controlling the crystal grain size of the spin valve film. Specifically, the crystal grain size of the spin valve film can be controlled to be not smaller than 5 nm and not larger than 20 nm, so that a high MR ratio can be achieved without causing variation in characteristic even when the size of the magneto-resistance effect device becomes small.

Incidentally, by setting the crystal grain size of the seed layer 12b to be not smaller than 5 nm and not larger than 20 nm, electron diffuse reflection and inelastic scattering sites due to crystal grain boundaries can be reduced. To obtain this crystal grain size, 2 nm-thick Ru is formed. In the case of $(Ni_xFe_{100-x})_{100-y}Z_y$ (Z=Cr, V, Nb, Hf, Zr, Mo), it is preferable that a thickness of 2 nm is formed while a composition y of the third element X is set to be about 0% to 30% (inclusive of the case where y=0).

The crystal grain size of the spin valve film can be discriminated based on the crystal grain size of a layer disposed between the seed layer 12b and the spacer layer 16 (e.g. can be determined based on a cross-sectional TEM or the like). For example, when the pin layer 14 is a bottom type spin valve film located as a layer under the spacer layer 16, it can be discriminated based on the crystal grain size of the pinning layer 13 (antiferromagnetic layer) or the pin layer 14 (magnetization pinned layer) formed on the seed layer 12b.

The pinning layer 13 has a function of giving unidirectional anisotropy to the ferromagnetic layer serving as the pin layer 14 formed thereon to thereby fix magnetization. As the material of the pinning layer 13, an antiferromagnetic material such as PtMn, PdPtMn, IrMn or RuRhMn can be used. Of these, IrMn is favorable as the material of a head supporting high recording density. Because IrMn can give unidirectional anisotropy even when IrMn is thinner in film thickness than PtMn, IrMn is suitable for forming a narrow gap required for high density recording.

To give sufficiently intensive unidirectional anisotropy, the film thickness of the pinning layer 13 is set suitably. When the material of the pinning layer 13 is PtMn or PdPtMn, the film thickness is set preferably to be not smaller than 8 nm and not larger than 20 nm, and more preferably to be not smaller than 10 nm and not larger than 15 nm. When the material of the pinning layer 13 is IrMn, the film thickness is set preferably to be not smaller than 4 nm and not larger than 18 nm, and more preferably to be not smaller than 5 nm and not larger than 15 nm because unidirectional anisotropy can be given even when IrMn is thinner in film thickness than PtMn or the like. As a preferable example, 7 nm-thick $Ir_{22}Mn_{78}$ can be formed.

As the pinning layer 13, a hard magnetic layer may be used in place of the antiferromagnetic layer. For example, CoPt (Co=50% to 85%), $(Co_xPt_{100-x})_{100-y}Cr_y$ (x=50% to 85%, y=0% to 40%) or FePt (Pt=40% to 60%) can be used as the hard magnetic layer. Because the hard magnetic layer (particularly, CoPt) is relatively low in specific resistance, increase in series resistance and resistance-area RA can be suppressed.

Here, the resistance-area RA means a product of a sectional area perpendicular to the lamination direction of the laminated film of the magneto-resistance effect device 10 and resistance obtained from the pair of electrodes when a current is applied perpendicularly to the film plane of the laminated film of the magneto-resistance effect device 10.

The crystal orientation of the spin valve film or the pinning layer 13 can be measured by X-ray diffraction. A good orientation can be obtained when the half-value width of a rocking curve at the fcc (111) peak of the spin valve film or the fct (111) peak or bcc (110) peak of the pinning layer 13 (PtMn) is 3.5° to 6°. Incidentally, the dispersion angle of this orientation can be discriminated based on diffraction spots using cross-sectional TEM.

The pin layer 14 is configured so that a lower pin layer 141, a magnetic coupling layer 142 and an upper pin layer 143 are laminated in this order in view from the pinning layer 13 side.

The pinning layer 13 and the lower pin layer 141 are magnetically exchange-coupled to each other so that unidirectional anisotropy is given. The lower pin layer 141 and the upper pin layer 143 between which the magnetic coupling layer 142 is sandwiched are coupled to each other so firmly that the magnetization directions thereof are antiparallel to each other.

For example, a $Co_xFe_{100-x}$ alloy (x=0% to 100%), an $Ni_xFe_{100-x}$ alloy (x=0% to 100%) or a material obtained by adding a nonmagnetic element thereto can be used as the material of the lower pin layer 141. A single element such as Co, Fe or Ni or an alloy thereof can be also used as the material of the lower pin layer 141.

It is preferable that the film thickness of the lower pin layer 141 is not smaller than 2 nm and not larger than 5 nm. This is for the purpose of keeping unidirectional anisotropic magnetic field intensity due to the pinning layer 13 high and keeping antiferromagnetic coupling magnetic field intensity between the lower pin layer 141 and the upper pin layer 143 through the magnetic coupling layer 142 high.

If the lower pin layer 141 is too thin, the MR ratio is reduced because the upper pin layer 143 giving an influence to the MR ratio must be made thin. On the other hand, if the lower pin layer 141 is too thick, it is difficult to obtain sufficient unidirectional anisotropic magnetic field intensity necessary for device operation.

In consideration of the magnetic film thickness (saturation magnetization Bs×film thickness t (the product Bs·t)) of the lower pin layer 141, it is preferable that the magnetic film thickness of the lower pin layer 141 is substantially equal to the magnetic film thickness of the upper pin layer 143. That is, it is preferable that the magnetic film thickness of the upper pin layer 143 and the magnetic film thickness of the lower pin layer 141 correspond to each other.

For example, when the upper pin layer 143 is ($Fe_{50}Co_{50}$ [1 nm]/Cu [0.25 nm])×2/$Fe_{50}Co_{50}$ [1 nm], the magnetic film thickness is 2.2 T×3 nm=6.6 T nm because the saturation magnetization of $Fe_{50}Co_{50}$ in the thin film is about 2.2 T. Because the saturation magnetization of $Co_{90}Fe_{10}$ is about 1.8 T, the film thickness t of the lower pin layer 141 giving a magnetic film thickness equal to the above becomes 6.6 T nm/1.8 T=3.47 nm. Accordingly, in this case, it is preferable that $Co_{90}Fe_{10}$ about 3.6 nm in film thickness is used as the lower pin layer 141. When $Co_{75}Fe_{25}$ is used as the lower pin layer 141, it is preferable from the same calculation that the lower pin layer 141 has a film thickness of about 3.3 nm.

Here, '/' means that materials written in the left of '/' are laminated successively. The description 'Au/Cu/Ru' means that a Cu layer is laminated on an Au layer and an Ru layer is laminated on the Cu layer. In addition, '×2' means two layers.

The description '(Au/Cu)×2' means that a Cu layer is laminated on an Au layer, and an Au layer and a Cu layer are further laminated on the Cu layer successively. In addition, '[ ]' means the film thickness of the material.

The magnetic coupling layer 142 has a function of forming a synthetic pin structure by bringing antiferromagnetic coupling to the lower pin layer 141 and the upper pin layer 143 between which the magnetic coupling layer 142 is sandwiched. Ru can be used as the magnetic coupling layer 142. It is preferable that the film thickness of the magnetic coupling layer 142 is not smaller than 0.8 nm and not larger than 1 nm. Incidentally, another material than Ru may be used as the magnetic coupling layer 142 as long as the material can bring sufficient antiferromagnetic coupling to the lower pin layer 141 and the upper pin layer 143 between which the magnetic coupling layer 142 is sandwiched. As the film thickness of the magnetic coupling layer 142, a film thickness of 0.3 nm to 0.6 nm, both inclusively, corresponding to a first peak of RKKY (Ruderman-Kittel-Kasuya-Yoshida) coupling may be used in place of a film thickness of 0.8 nm to 1 nm, both inclusively, corresponding to a second peak of RKKY coupling. Ru with a film thickness of 0.9 nm capable of obtaining characteristic of higher reliable coupling stably can be taken here as an example.

The upper pin layer 143 is a magnetic layer directly contributing to the MR effect. Both constituent material and film thickness are important to obtain a large MR ratio. The magnetic material located in an interface between the upper pin layer 143 and the spacer layer 16 is particularly important from the viewpoint of contribution to spin-dependent interfacial scattering. The spin-dependent interfacial scattering is a phenomenon that an MR effect is exhibited in an interface between the spacer layer and the free layer or the pin layer.

$Fe_{50}Co_{50}$ can be used as the upper pin layer 143. $Fe_{50}Co_{50}$ is a magnetic material having a bcc structure. This material can achieve a large MR ratio because the spin-dependent interfacial scattering effect is large. As an FeCo-based alloy having a bcc structure, $Fe_xCo_{100-x}$ (x=30% to 100%) or a material obtained by adding an additive element to $Fe_xCo_{100-x}$ can be used. Among these, $Fe_{40}Co_{60}$ to $Fe_{80}Co_{20}$ satisfying various characteristics are examples of an easy-to-use material.

When the upper pin layer 143 is made of a magnetic layer having a bcc structure easy to achieve a high MR ratio, it is preferable that the total film thickness of this magnetic layer is not smaller than 1.5 nm. This is for the purpose of keeping the bcc structure stable. Because it is often that the metal material used as the spin valve film has an fcc structure or an fct structure, only the upper pin layer 143 may have a bcc structure. For this reason, if the film thickness of the upper pin layer 143 is too thin, it is difficult to keep the bcc structure stable so that a high MR ratio cannot be obtained.

In such a case, a laminate of 1 nm-thick $Fe_{50}Co_{50}$, 0.25 nm-thick Cu, 1 nm-thick $Fe_{50}Co_{50}$, 0.25 nm-thick Cu and 1 nm-thick $Fe_{50}Co_{50}$ can be used as the upper pin layer 143.

In the upper pin layer 143 having such a laminate structure in which magnetic layers (FeCo layers) and nonmagnetic layers (Cu layers) are laminated alternately, the spin-dependent scattering effect called spin-dependent bulk scattering effect can be improved by the interposition of the Cu layers in the upper pin layer 143. The spin-dependent bulk scattering effect is a phenomenon that an MR effect is exhibited in the inside of the free layer or the pin layer.

Although it is easy to obtain a large MR ratio when the film thickness of the upper pin layer 143 is large, it is preferable that the film thickness of the upper pin layer 143 is small enough to obtain a large pin-fixing magnetic field. There is a trade-off relation as to the film thickness of the upper pin layer 143. For example, when an FeCo ally layer having a bcc structure is used, a film thickness not smaller than 1.5 nm is preferred because it is necessary to keep the bcc structure stable. When a CoFe alloy layer having an fcc structure is used, a film thickness not smaller than 1.5 nm is still preferred to obtain a large MR ratio. On the other hand, to obtain a large pin-fixing magnetic field, the film thickness of the upper pin layer 143 is set preferably to be not larger than 5 nm, and more preferably to be not larger than 4 nm. As described above, the film thickness of the upper pin layer 143 is set preferably to be not smaller than 1.5 nm and not larger than 5 nm, and more preferably to be not smaller than 2.0 nm and not larger than 4 nm.

In the upper pin layer 143, a $Co_{90}Fe_{10}$ alloy having an fcc structure or Co or a Co ally having an hcp structure which has been heretofore used widely in a magneto-resistance effect device can be used in place of the magnetic material having a bcc structure. A single metal such as Co, Fe or Ni, or an alloy material containing any one of these elements can be used as the upper pin layer 143. Examples of material advantageous to obtain a large MR ratio as the magnetic material of the upper pin layer 143 are an FeCo alloy material having a bcc structure, a cobalt alloy having a cobalt composition containing 50% or more of cobalt, and an Ni composition containing 50% or more of Ni.

A Heusler magnetic alloy layer such as $Co_2MnGe$, $Co_2MnSi$ or $Co_2MnAl$ may be used as the upper pin layer 143.

The spacer layer 16 has a function of decoupling the magnetic coupling of the pin layer 14 and the free layer 18. Any element of Au, Ag and Cu can be used as the spacer layer 16. It is preferable that the film thickness of the spacer layer 16 is not smaller than 1.5 nm and not larger than 5 nm.

The free layer 18 is a layer having a ferromagnetic substance in which the magnetization direction changes according to an external magnetic field. For example, a double layer structure of $Co_{90}Fe_{10}$ [1 nm]/$Ni_{83}Fe_{17}$ [3.5 nm] using CoFe formed in an interface and NiFe can be used. Incidentally, when an NiFe layer is not used, a single layer of $Co_{90}Fe_{10}$ [4 nm] can be used. Alternatively, the free layer 18 made of a triple layer structure of CoFe/NiFe/CoFe or the like may be used.

$Co_{90}Fe_{10}$ is preferred as the free layer 18 because $Co_{90}Fe_{10}$ has stable soft magnetic characteristic among CoFe alloys. When a CoFe alloy close to $Co_{90}Fe_{10}$ is used, it is preferable that the film thickness is set to be not smaller than 0.5 nm and not larger than 4 nm. Besides this, $Co_xFe_{100-x}$ (x=70% to 90%) may be used.

A laminate in which CoFe layers or Fe layers having a thickness of 1 nm to 2 nm, both inclusively, and very thin Cu layers having a thickness of 0.1 nm to 0.8 nm, both inclusively, are laminated alternately may be used as the free layer 18.

An amorphous magnetic layer such as CoZrNb may be used as part of the free layer 18. Incidentally, even when an amorphous magnetic layer is used, it is necessary to use a magnetic layer having a crystal structure in an interface with the spacer layer 16 giving a large influence on the MR ratio. As the structure of the free layer 18, the following configuration can be provided in view of the spacer layer 16 side. That is, as the structure of the free layer 18, (1) only a crystal layer, (2) a laminate of a crystal layer and an amorphous layer, (3) a laminate of a crystal layer, an amorphous layer and a crystal layer, or the like, may be considered. What is important here is that a crystal layer is always in contact with an interface with the spacer layer 16 in any one of (1) to (3).

The cap layer 19 has a function of protecting the spin valve film. For example, the cap layer 19 can be formed as a plurality of metal layers such as a double layer structure of a Cu layer and an Ru layer (Cu [1 nm]/Ru [10 nm]). As the cap layer 19, an Ru/Cu layer or the like containing Ru disposed on the free layer 18 side may be used. In this case, it is preferable that the film thickness of Ru is not smaller than 0.5 nm and not larger than 2 nm. Particularly the thus configured cap layer 19 is preferable in the case where the free layer 18 is made of NiFe. This is because Ru and Ni are so immiscible that magnetostriction of an interfacial mixing layer formed between the free layer 18 and the cap layer 19 can be reduced.

When the cap layer 19 is either Cu/Ru or Ru/Cu, it is preferable that the film thickness of the Cu layer is not smaller than 0.5 nm and not larger than 10 nm, and the film thickness of the Ru layer can be set to be not smaller than 0.5 nm and not larger than 5 nm. Because the specific resistance value of Ru is so high that use of a too thick Ru layer is undesirable, it is preferable that such a film thickness range is set.

As the cap layer 19, other metal layers may be provided in place of the Cu layer and the Ru layer. The configuration of the cap layer 19 is not particularly limited but another material may be used as long as the material can serve as the cap for protecting the spin valve layer. It is however necessary to pay attention because the MR ratio or long-term reliability may vary according to selection of the cap layer. Cu and Ru are examples of materials of the cap layer preferred from these viewpoints.

The function layer 21 has a spin filter effect by which transmission of up-spin electrons or down-spin electrons can be controlled. The function layer 21 is characterized by containing mixed oxide of at least one element of Zn, In, Sn and Cd and at least one element of Fe, Co and Ni. Specifically, mixed oxide of $Fe_{50}Co_{50}$ and Zn can be used. Incidentally, Zn is more preferred because Zn among In, Sn and Cd belongs to the same periodic group as Fe, Co and Ni so that Zn is easily magnetized to stabilize magnetization of the function layer 21 when Zn is mixed with Fe, Co and Ni as mixed oxide.

When these materials are used, a high spin filter effect and reduction of spin-flip due to achievement of low resistivity can be made consistent with each other so that the MR ratio of the magneto-resistance effect device 10 can be improved.

Here, to achieve a low resistivity spin filtering layer, it is effective that the spin filtering layer contains the aforementioned oxide material containing Zn, In, Sn and Cd such as ZnO, $In_2O_3$, $SnO_2$, ZnO, CdO, $CdIn_2O_4$, $Cd_2SnO_4$ or $Zn_2SnO_4$. Although these oxide semiconductors are semiconductors having a band gap of 3 eV or higher, conduction electron density reaches about $10^{18}$ cm$^{-3}$-$10^{19}$ cm$^{-3}$ because intrinsic defects such as oxygen holes form a donor level when these oxide semiconductors are slightly shifted to a reducing direction from the stoichiometric composition. In the band structure of these conductive oxides, the valence band is mainly formed from 2p orbits of oxygen atoms whereas the conduction band is mainly formed from s orbits of metal atoms. When the carrier density Fermi level increases to be higher than $10^{18}$ cm$^{-3}$, it reaches the conduction band to bring a state called degeneracy. Such an oxide semiconductor is called n-type degenerate semiconductor and has a sufficient concentration and mobility of conduction electrons to achieve low resistivity.

On the other hand, to achieve a spin filtering layer having a high spin filter effect, it is effective that the spin filtering layer contains oxide of Co, Fe and Ni having magnetism at room temperature. An oxide material containing Zn, In, Sn and Cd effective in achievement of low resistivity has no magnetism as bulk characteristic. Although disclosure has been made in JP-A-2004-6589 that even a nonmagnetic oxide material exhibits magnetism to obtain a spin filter effect when a very thin oxide layer is inserted in the free layer or the pin layer, the oxide material may contain oxide of Co, Fe and Ni to exhibit magnetism more easily to obtain a high spin filter effect without limitation in film thickness of the oxide layer.

An additive element may be further added to the function layer 21. There is a report that heat resistance is improved when Al as an additive element is added to Zn oxide. Besides Al, B, Ga, C, Si, Ge, Sn, or the like may be used as the additive element. Although the mechanism to improve heat resistance is not entirely clear, it is considered that the mechanism to improve heat resistance is caused by change in carrier density because density of oxygen holes formed in Zn oxide shifted to a reducing direction from the stoichiometric composition is reduced by acceleration of re-oxidation due to heat. As another reason of improvement of heat resistance, these aforementioned elements are equivalent to Group III or Group IV dopants which can suppress change of carrier density in the function layer 21 and can further suppress change of resistivity according to heat in order to prevent acceleration of re-oxidation of Zn atoms due to heat.

It is preferable that the film thickness of the function layer 21 is not smaller than 0.5 nm to obtain a sufficient spin filtering effect. It is further preferable that the film thickness of the function layer 21 is not smaller than 1 nm to obtain a more uniform function layer 21 in consideration of dependence of the device in terms of manufacturing. On the other hand, it is preferable that the upper limit of the film thickness is not larger than 10 nm from the viewpoint of preventing the read gap of the reproduction head from being widened.

When the function layer 21 is formed in an interface between the free layer 18 and the spacer layer 16, a soft magnetic film more excellent in soft magnetic characteristic than a magnetic compound can be used as the free layer 18 to improve magnetic field responsiveness. The same rule can be applied to the case where the function layer 21 is provided inside the free layer 18 or in an interface between the free layer 18 and the cap layer 19 as shown in a modification which will be described later. Single metals such as Co, Fe and Ni or all alloy materials containing any one of these elements can be used in the free layer 18. Particularly, as described above, a double layer structure of $Co_{90}Fe_{10}$ [1 nm]/$Ni_{83}Fe_{17}$ [3.5 nm] using NiFe on CoFe formed in an interface, a triple layer structure of CoFe/NiFe/CoFe etc., a single layer of a Co—Fe alloy, or the like, can be used.

When function layers 21 are formed in an interface between the pin layer 14 and the spacer layer 16, inside the pin layer 14 and in an interface between the magnetic coupling layer 142 and the pin layer 14, a material which can be more easily pinned in one direction than the function layers 21 may be used as the upper pin layer 143 to improve pin characteristic. Single metals such as Co, Fe and Ni or all alloy materials containing any one of these elements can be used as the material of the upper pin layer 143.

When function layers 21 are formed in an interface between the free layer 18 and the spacer layer 16 and in an interface between the pin layer 14 and the spacer layer 16, increase in the MR ratio caused by increase in spin-dependent interfacial scattering due to the spin filtering effect of the function layers 21 can be obtained. On the other hand, when function layers 21 are formed inside the free layer 18, in an interface between the free layer 18 and the cap layer 19, inside the pin layer 14 and in an interface between the upper pin layer 143 and the magnetic coupling layer 142, spin-dependent bulk scattering can be intensified by the spin filtering effect of the function layers 21 so that the MR ratio can be intensified.

A plurality of function layers 21 may be provided in the free layer 18 or the pin layer 14. For example, when function layers 21 are provided in an interface between the spacer layer 16 and the free layer 18 and inside the free layer 18, both spin-dependent interfacial scattering and spin-dependent bulk scattering can be intensified so that a high MR ratio can be achieved. It is however necessary to suppress the number of function layers 21 to be inserted to a suitable number because occurrence of spin-flip is caused by increase in resistance when the number to be inserted is too large. For example, about four function layers 21 can be provided inside the free layer 18 or the pin layer 14.

When a function layer 21 is formed in an interface between the free layer 18 and the spacer layer 16 as shown in FIG. 1, the function layer 21 contributes to spin-dependent interfacial scattering as described above.

Incidentally, it is impossible to provide any function layer 21 inside the spacer layer 16. This is based on the following reasons. The first reason is that when the function layer 21 is provided inside the spacer layer 16, oxygen contained in the function layer 21 is diffused in the spacer layer 16 to thereby generate considerable spin-flip of conduction electrons passing through the spacer layer 16 so that the conduction electrons passing through the spacer layer 16 lose spin information. The second reason is that simply free magnetization is generated to inhibit conduction electrons passing through the spacer layer 16 because the function layer 21 is magnetically coupled neither to the free layer 18 nor to the pin layer 14.

A method of manufacturing the magneto-resistance effect device 10 according to this embodiment will be described below.

In this embodiment, a sputtering method such as DC magnetron sputtering or RF magnetron sputtering, an ion beam sputtering method, a vapor deposition method, a CVD (Chemical Vapor Deposition) method, an MBE (Molecular Beam Epitaxy) method, or the like, can be used as a forming method at the time of manufacturing.

Figure 3:
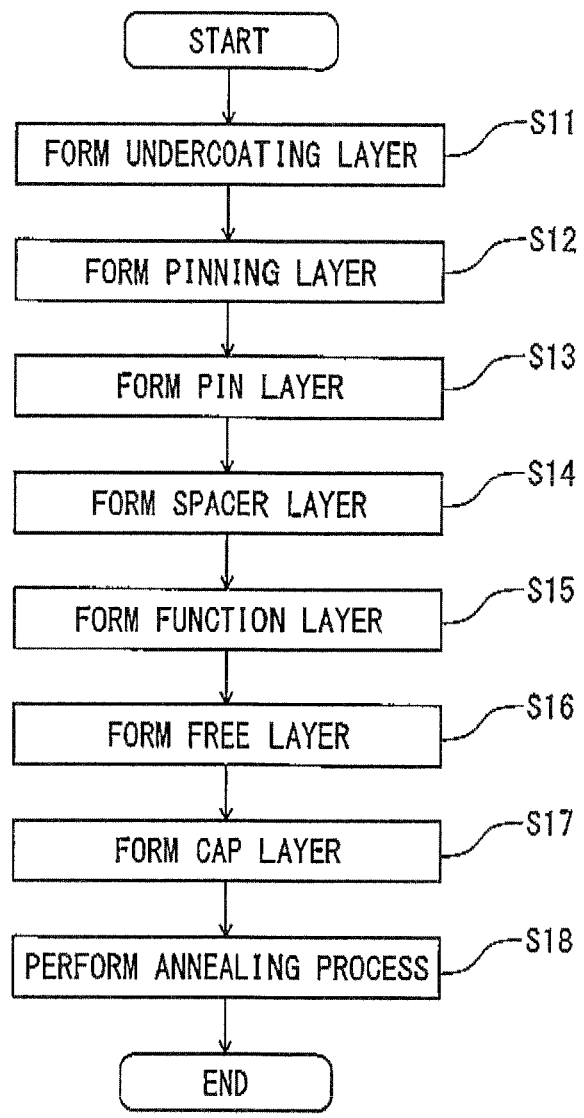
FIG. 3 is a flow chart for explaining a method of manufacturing the magneto-resistance effect device according to the first embodiment.

FIG. 3 is a flow chart for explaining a process of manufacturing the magneto-resistance effect device 10.

In step S11, an electrode 11 is formed on a substrate (not shown) by a microfabrication process in advance. Then, for example, Ta [1 nm]/Ru [2 nm] as an undercoating layer 12 is formed on the electrode 11. Ta is equivalent to the buffer layer 12a for relaxing roughness of the lower electrode. Ru is equivalent to the seed layer 12b for controlling the crystal orientation and crystal grain size of the spin valve film formed thereon.

In step S12, a pinning layer 13 is formed on the undercoating layer 12. An antiferromagnetic material such as PtMn, PdPtMn, IrMn or RuRhMn can be used as the material of the pinning layer 13.

In step S13, a pin layer 14 is formed on the pinning layer 13. The pin layer 14 can be provided as a synthetic pin layer, for example, having a lower pin layer 141 ($Co_{90}Fe_{10}$ [4 nm]), a magnetic coupling layer 142 (Ru), and an upper pin layer 143 ($Co_{90}Fe_{10}$ [4 nm]).

In step S14, a spacer layer 16 is formed on the pin layer 14. The spacer layer 16 is made of any one metal of Au, Ag and Cu.

In step S15, a function layer 21 is formed on the spacer layer 16. Specifically, a metal layer of $Fe_{50}Co_{50}$ and Zn is formed on the upper pin layer 143. Here, the metal layer of $Fe_{50}Co_{50}$ and Zn may be provided as a laminate of an $Fe_{50}Co_{50}$ layer and a Zn layer such as $Fe_{50}Co_{50}$/Zn, Zn/Fe$_{50}$Co$_{50}$ or (Fe$_{50}$Co$_{50}$/Zn)×2 or may be provided as a single layer of an alloy such as Zn$_{50}$(Fe$_{50}$Co$_{50}$)$_{50}$. A metal material containing Zn and Fe$_{50}$Co$_{50}$ is oxidized to form the function layer 21. This conversion process can use ion assisted oxidation (IAO) which is performed in the presence of supplied oxygen while irradiating a metal material layer with an ion beam or plasma of rare gas or the like. In the aforementioned ion assisted conversion process, oxygen gas may be ionized or formed as plasma. By energy assist to the metal material layer due to ion beam irradiation, a stable and uniform oxide layer can be formed as the function layer 21. For formation of one function layer 21, the aforementioned formation and conversion process of the metal material layer may be repeated several times. In this case, it is preferable that a function layer 21 having a predetermined film thickness is not provided by one formation and conversion process but the film thickness is divided so that a conversion process is applied to a metal material layer having a small film thickness. Natural oxidation to expose a metal material layer containing Zn and Fe$_{50}$Co$_{50}$ to an oxygen atmosphere may be used. To form stable oxide, an oxidation method using energy assist is however preferred. When a metal material of Zn and Fe$_{50}$Co$_{50}$ is provided as a laminate, it is preferable that oxidation is made under ion beam irradiation to form a function layer 21 of evenly mixed Zn and Fe$_{50}$Co$_{50}$.

Incidentally, besides ion beam irradiation, heating treatment or the like may be performed as an energy assist method. In this case, for example, oxygen may be supplied while a metal material layer is heated at a temperature of 100° C. to 300° C. after the formation of the metal material layer.

Beam conditions in the case where an ion beam assisted process is performed in a conversion process for forming a function layer 21 will be described below. In the case where the aforementioned rare gas is ionized or provided as plasma and radiated when a function layer 21 is formed by a conversion process, it is preferable that an acceleration voltage V thereof is set to be 30V to 130V and a beam current Ib is set to be 20 mA to 200 mA. These conditions are remarkably weak conditions in comparison with the condition for performing ion beam etching. Even when plasma such as RF plasma is used in place of the ion beam, the function layer 21 can be formed likewise. The incidence angle of the ion beam is changed suitably in a range of 0° to 80° when the angle of incidence of the ion beam perpendicular to the film plane is defined as 0° and the angle of incidence of the ion beam parallel to the film plane is defined as 90°. The processing time due to this process is preferably 15 seconds to 1200 seconds and more preferably not shorter than 30 seconds from the viewpoint of controllability or the like. If the processing time is too long, productivity of the magneto-resistance effect device decreases unfavorably. It is preferable from these viewpoints that the processing time is 30 seconds to 600 seconds.

In an oxidation process using ion or plasma, oxygen exposure of $1\times10^3$ to $1\times10^4$ L (1 L=$1\times10^{-6}$ Torr×sec) is preferred in the case of IAO. In the case of natural oxidation, oxygen exposure of $3\times10^3$ L to $3\times10^4$ L is preferred.

In step S16, a free layer 18 is formed on the function layer 21. For example, Co$_{90}$Fe$_{10}$ [4 nm] is formed as the free layer 18.

In step S17, a cap layer 19 is formed on the free layer 18. For example, Cu [1 nm]/Ru [10 nm] is formed as the cap layer 19.

In step S18, an annealing process is performed.

Finally, an electrode 20 for applying a current perpendicularly to the magneto-resistance effect device 10 is formed on the cap layer 19.

(Modification 1)

Figure 4:
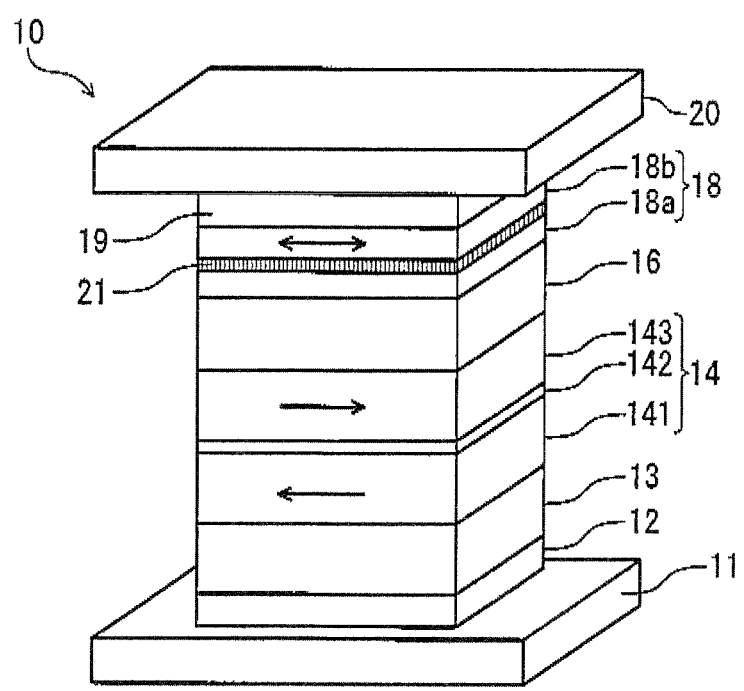
FIG. 4 is a view showing the configuration of a magneto-resistance effect device according to a first modification.

FIG. 4 is a view showing a first modification of the magneto-resistance effect device 10 according to the first embodiment.

This modification is different from the first embodiment in that the function layer 21 is provided inside the free layer 18. The free layer 18 includes a first free layer 18a and a second free layer 18b. Incidentally, the first free layer 18a is provided between the spacer layer 16 and the function layer 21 while the second free layer 18b is provided between the cap layer 19 and the function layer 21.

For formation of the function layer 21 inside the free layer 18, the spacer layer 16, the function layer 21 and the second free layer 18b are formed successively on the first free layer 18a.

When the function layer 21 is provided inside the free layer 18 in this manner, the function layer 21 contributes to spin-dependent bulk scattering as described above. Because the function layer 21 is magnetically coupled to the free layer 18 to make the magnetization direction of the function layer 21 free similarly to the free layer 18, the function layer 21 contributes to improvement of the MR ratio of the magneto-resistance effect device 10 without inhibition of the function of the free layer 18. Moreover, because oxygen contained in the function layer 21 can be restrained from being diffused into the spacer layer 16, occurrence of spin-flip in the spacer layer 16 as caused by the presence of any oxygen element in the spacer layer 16 can be suppressed so that a high MR ratio can be obtained.

(Modification 2)

Figure 5:
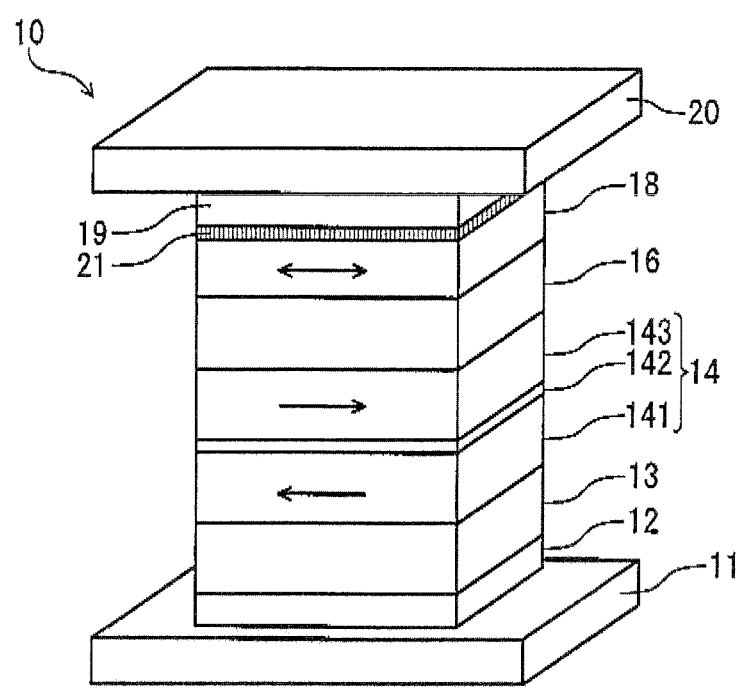
FIG. 5 is a view showing the configuration of a magneto-resistance effect device according to a second modification.

FIG. 5 is a view showing a second modification of the magneto-resistance effect device 10 according to the first embodiment.

This modification is different from the first embodiment in that the function layer 21 is provided between the free layer 18 and the cap layer 19.

When the function layer 21 is provided between the free layer 18 and the cap layer 19 in this manner, the function layer 21 contributes to spin-dependent bulk scattering as described above. Because the function layer 21 is made of oxide, the function layer 21 can protect the magneto-resistance effect device 10 from deterioration such as oxidation. Moreover, because oxygen contained in the function layer 21 can be restrained from being diffused into the spacer layer 16, occurrence of spin-flip in the spacer layer 16 as caused by the presence of any oxygen element in the spacer layer 16 can be suppressed so that a high MR ratio can be obtained.

(Modification 3)

Figure 6:
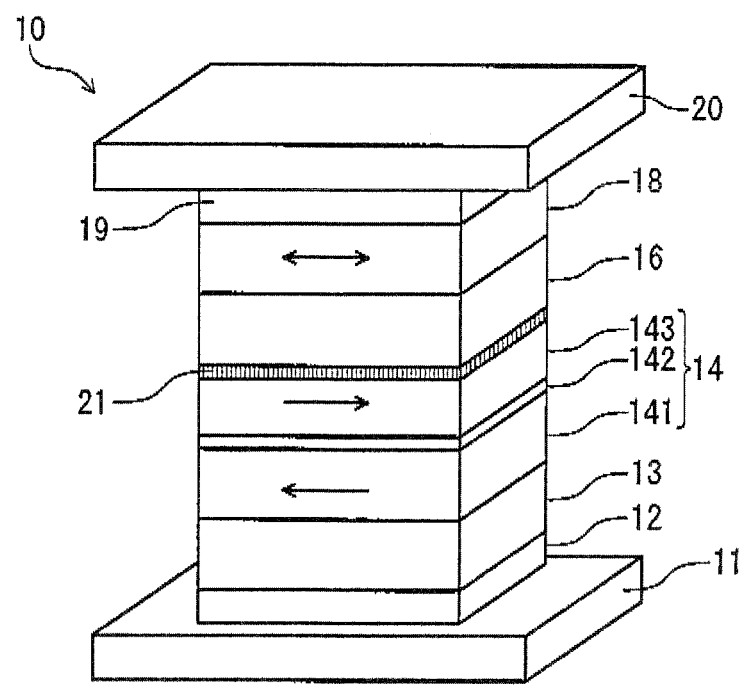
FIG. 6 is a view showing the configuration of a magneto-resistance effect device according to a third modification.

FIG. 6 is a view showing a third modification of the magneto-resistance effect device 10 according to the first embodiment.

This modification is different from the first embodiment in that the function layer 21 is provided between the pin layer 14 and the spacer layer 16.

When the function layer 21 is provided between the pin layer 14 and the spacer layer 16 in this manner, the function layer 21 contributes to spin-dependent interfacial scattering as described above. Because the function layer 21 is made of oxide so that the function layer 21 can prevent the constituent material of the spacer layer 16 and the constituent material of the pin layer 14 from being mixed with each other, the spacer layer 16 can make conduction electrons pass through while suppressing spin-flip so that the magnetization of the pin layer 14 can be fixed stably.

(Modification 4)

Figure 7:
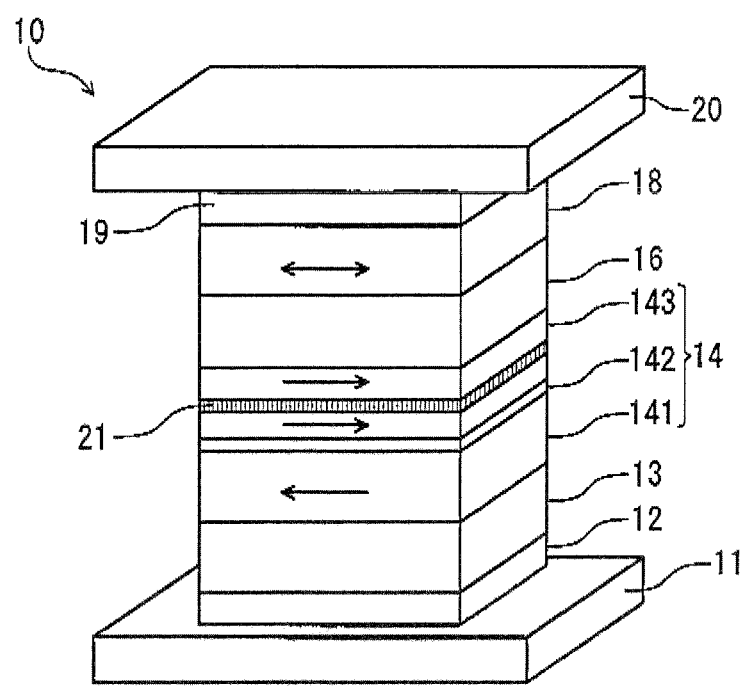
FIG. 7 is a view showing the configuration of a magneto-resistance effect device according to a fourth modification.

FIG. 7 is a view showing a fourth modification of the magneto-resistance effect device 10 according to the first embodiment.

This modification is different from the first embodiment in that the function layer 21 is provided inside the upper pin layer 143.

When the function layer 21 is provided inside the upper pin layer 143 in this manner, the function layer 21 contributes to spin-dependent bulk scattering as described above. Because oxygen contained in the function layer 21 is restrained from being diffused into the spacer layer when the function layer 21 is disposed in a position being not in contact with the spacer layer, spin-flip in the spacer layer as caused by the presence of any oxygen element in the spacer layer can be avoided so that a high MR ratio can be obtained.

(Modification 5)

Figure 8:
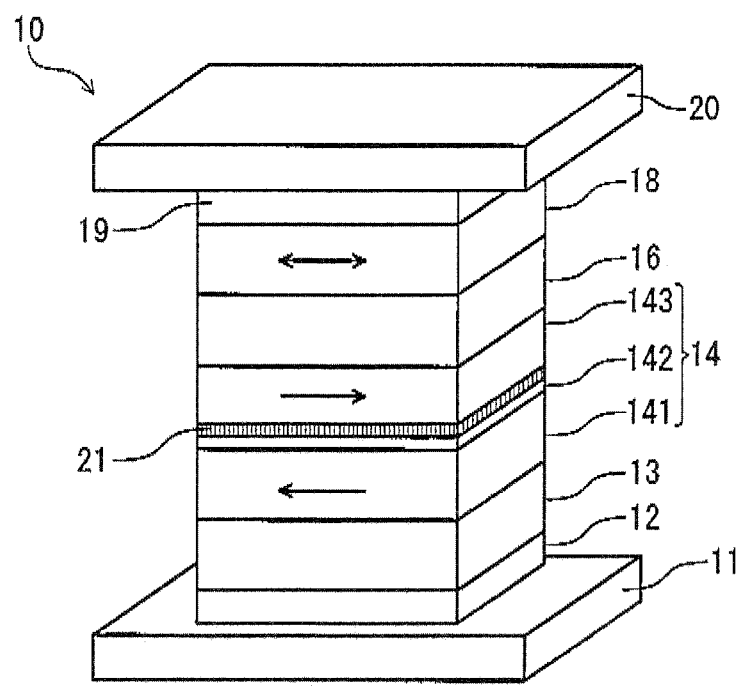
FIG. 8 is a view showing the configuration of a magneto-resistance effect device according to a fifth modification.

FIG. 8 is a view showing a fifth modification of the magneto-resistance effect device 10 according to the first embodiment.

This modification is different from the first embodiment in that the function layer 21 is provided between the upper pin layer 143 and the magnetic coupling layer 142.

When the function layer 21 is provided between the upper pin layer 143 and the magnetic coupling layer 142 in this manner, the function layer 21 contributes to spin-dependent bulk scattering as described above. Because oxygen contained in the function layer 21 is restrained from being diffused into the spacer layer when the function layer 21 is disposed in a position being not in contact with the spacer layer, spin-flip in the spacer layer as caused by the presence of any oxygen element in the spacer layer can be avoided so that a high MR ratio can be obtained.

(Modification 6)

Figure 9:
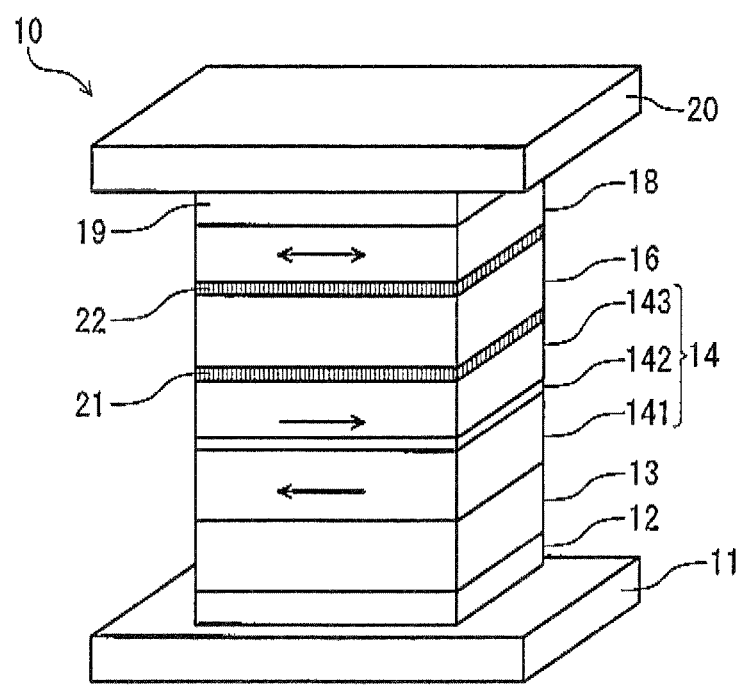
FIG. 9 is a view showing the configuration of a magneto-resistance effect device according to a sixth modification.

FIG. 9 is a view showing a sixth modification of the magneto-resistance effect device 10 according to the first embodiment.

This modification is different from the first embodiment in that a second function layer 22 is further provided between the spacer layer 16 and the free layer 18 in addition to the function layer 21 provided between the upper pin layer 143 and the spacer layer 16.

Incidentally, since the configuration of the function layer 21 is the same as that of the function layer 22, description thereof will be omitted.

When the second function layer 22 is further provided between the spacer layer 16 and the free layer 18 in addition to the function layer 21 provided between the upper pin layer 143 and the spacer layer 16 in this manner, an effect as the sum of spin filtering effects of the two function layers can be obtained so that a high MR ratio can be obtained in comparison with the case where one function layer is used.

Incidentally, because the magnet-resistance effect devices 10 according to the modifications 1 to 6 can be produced by use of the method of manufacturing the magnet-resistance effect device 10 described in the first embodiment, description about the method of manufacturing the magneto-resistance effect devices 10 according to the modifications 1 to 6 will be omitted.

EXAMPLES

Magneto-resistance effect devices 10 according to the first embodiment and the modifications 1 to 6 were produced and perpendicular current conduction was performed between the electrodes 11 and 20 to thereby evaluate the RA values of the magneto-resistance effect devices 10 and the MR ratios of the magneto-resistance effect devices 10.

Example 1

A magneto-resistance effect device 10 according to the first embodiment was produced and the RA value and MR ratio thereof were evaluated. That is, a structure in which the function layer 21 was provided between the spacer layer 16 and the free layer 18 as shown in FIG. 1 was produced.

As for the method of producing the function layer 21, 2 nm-thick $Fe_{50}Co_{50}$ was formed on the spacer layer 16 of Cu, and 0.6 nm-thick Zn was formed thereon. Then, this $Fe_{50}Co_{50}$ and Zn were converted into oxide of Zn and $Fe_{50}Co_{50}$ (hereinafter described as Zn—$Fe_{50}Co_{50}$—O) by IAO to thereby form the function layer 21. On this occasion, the film thickness of the function layer 21 was 3 nm. On this occasion, oxygen exposure used in IAO was used as $3.0 \times 10^4$ Langmiur. Then, 2 nm-thick $Fe_{50}Co_{50}$ was formed on the function layer 21 to thereby form the free layer 18. Finally, an annealing process was performed at 280° C. for 5 hours so that electrodes 11 and 20 were formed.

Incidentally, because the method of forming the function layer is the same in the following examples, description thereof will be omitted.

The configuration of the magneto-resistance effect device 10 formed in this example will be shown below.

Undercoating Layer 12: Ta [1 nm]/Ru [2 nm]
Pinning Layer 13: $Ir_{22}Mn_{78}$ [7 nm]
Pin Layer 14: $Co_{90}Fe_{10}$ [4.4 nm]/Ru [0.9 nm]/$Fe_{50}Co_{50}$ [4 nm]
Spacer Layer 16: Cu [3 nm]
Function Layer 21: Zn—$Fe_{50}Co_{50}$—O [3 nm]
Free Layer 18: $Fe_{50}Co_{50}$ [2 nm]

Figure 10:
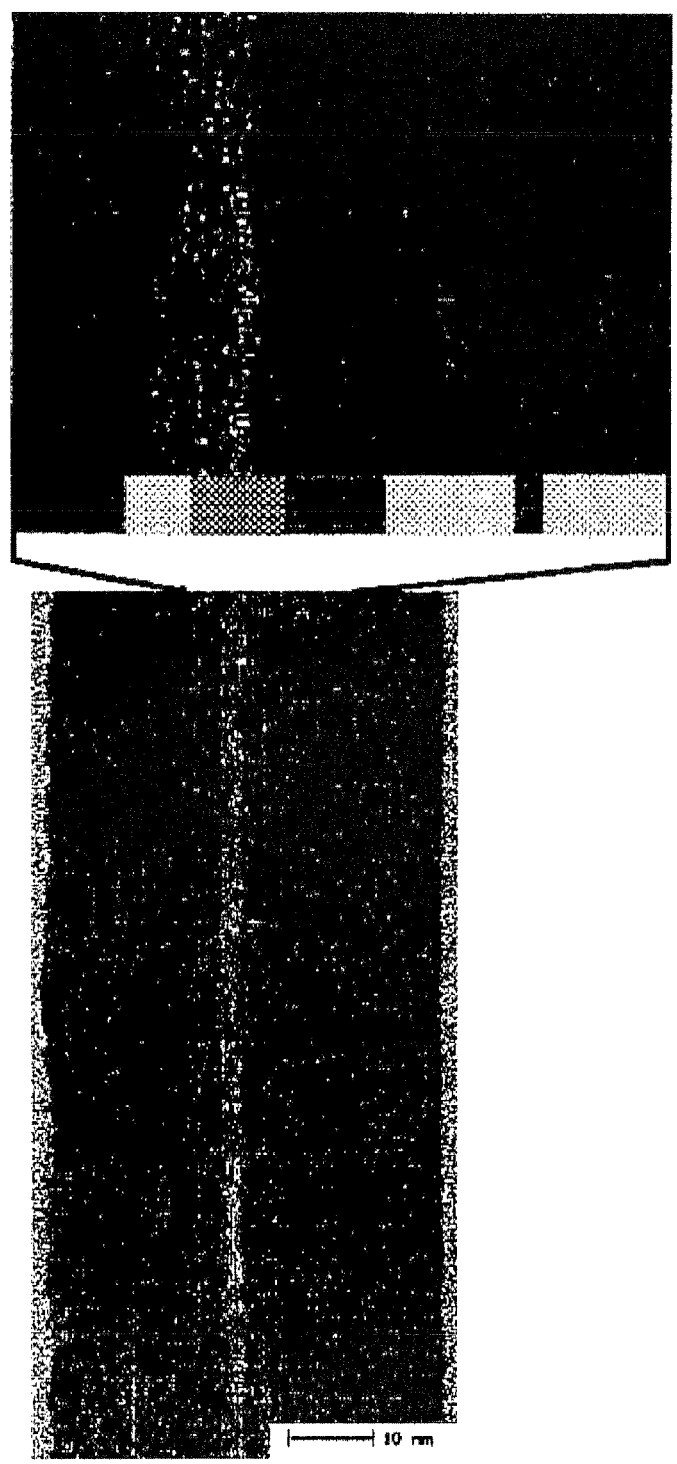
FIG. 10 is a view showing a cross-sectional TEM image of the magneto-resistance effect device.

FIG. 10 is a view showing a cross-sectional TEM image of the magneto-resistance effect device 10 according to this example. It can be confirmed that the function layer 21 is formed evenly in an interface between the spacer layer 16 and the free layer 18.

Figure 11:
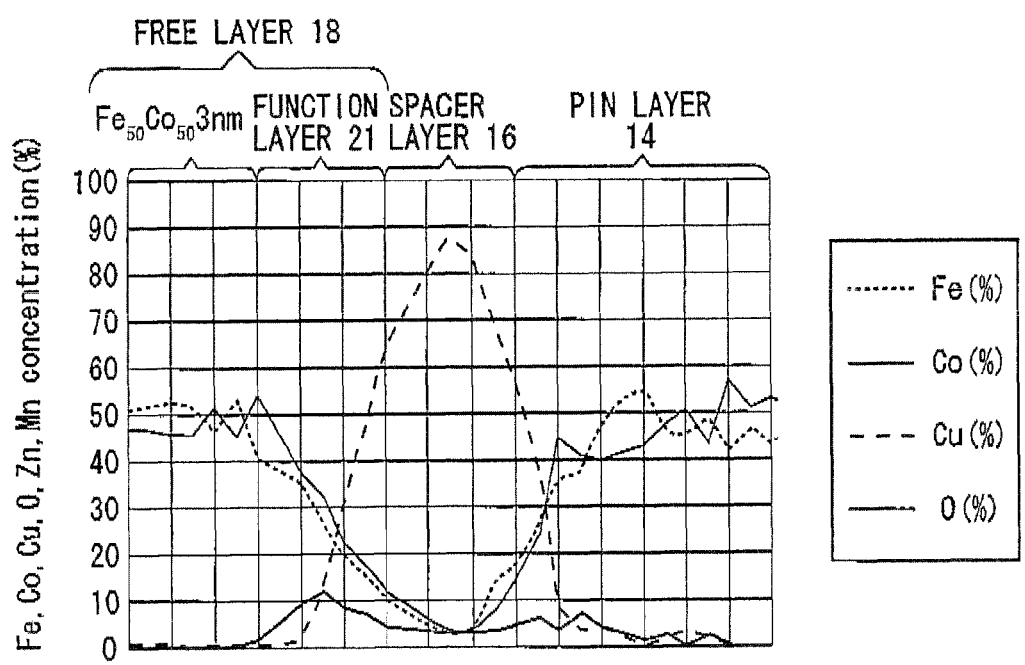
FIG. 11 is a graph showing a result of three-dimensional atom probe analysis of the magneto-resistance effect device.

FIG. 11 is a graph showing a result of element proxygram analysis in a film thickness direction of the magneto-resistance effect device 10 according to this example using a three-dimensional atom probe.

In a place corresponding to the function layer 21, peaks of Zn, ZnO, FeO and CoO are entirely in agreement, so that it can be known that an oxide layer of entirely mixed Zn and $Fe_{50}Co_{50}$ is formed.

Incidentally, in any magneto-resistance effect device according to the invention, it could be confirmed from the TEM image and three-dimensional atom probe analysis that the function layer was formed.

The RA of the magneto-resistance effect device 10 according to this example was $0.16 \Omega \mu m^2$, and the MR ratio thereof was 3.5%.

Example 2

A magneto-resistance effect device 10 according to Modification 1 was produced and the RA value and MR ratio thereof were evaluated. That is, a structure in which the function layer 21 was provided inside the free layer 18 as shown in FIG. 4 was produced.

Undercoating Layer 12: Ta [1 nm]/Ru [2 nm]
Pinning Layer 13: $Ir_{22}Mn_{78}$ [7 nm]
Pin Layer 14: $Co_{90}Fe_{10}$ [4.4 nm]/Ru [0.9 nm]/$Fe_{50}Co_{50}$ [4 nm]
Spacer Layer 16: Cu [3 nm]
Free Layer 18A: $Fe_{50}Co_{50}$ [1 nm]
Function Layer 21; Zn—$Fe_{50}Co_{50}$—O [3 nm]
Free Layer 18B: $Fe_{50}Co_{50}$ [1 nm]

The RA of the magneto-resistance effect device 10 according to this example was $0.18\Omega\mu m^2$, and the MR ratio thereof was 3%.

Example 3

A magneto-resistance effect device 10 according to Modification 2 was produced and the RA value and MR ratio thereof were evaluated. That is, a structure in which the function layer 21 was provided between the cap layer 19 and the free layer 18 as shown in FIG. 5 was produced.

Undercoating Layer 12: Ta [1 nm]/Ru [2 nm]
Pinning Layer 13: $Ir_{22}Mn_{78}$ [7 nm]
Pin Layer 14: $Co_{90}Fe_{10}$ [4.4 nm]/Ru [0.9 nm]/$Fe_{50}Co_{50}$ [4 nm]
Spacer Layer 16: Cu [3 nm]
Free Layer 18: $Fe_{50}Co_{50}$ [2 nm]
Function Layer 21: Zn—$Fe_{50}Co_{50}$—O [3 nm]

The RA of the magneto-resistance effect device 10 according to this example was $0.18\Omega\mu m^2$, and the MR ratio thereof was 2.5%.

Example 4

A magneto-resistance effect device 10 according to Modification 3 was produced and the RA value and MR ratio thereof were evaluated. That is, a structure in which the function layer 21 was provided between the spacer layer 16 and the upper pin layer 143 as shown in FIG. 6 was produced.

Undercoating Layer 12: Ta [1 nm]/Ru [2 nm]
Pinning Layer 13: $Ir_{22}Mn_{78}$ [7 nm]
Pin Layer 14: $Co_{90}Fe_{10}$ [4.4 nm]/Ru [0.9 nm]/$Fe_{50}Co_{50}$ [2 nm]
Function Layer 21: Zn—$Fe_{50}Co_{50}$—O [3 nm]
Spacer Layer 16: Cu [3 nm]
Free Layer 18: $Fe_{50}Co_{50}$ [4 nm]

The RA of the magneto-resistance effect device 10 according to this example was $0.2\Omega\mu m^2$, and the MR ratio thereof was 2.5%.

Example 5

A magneto-resistance effect device 10 according to Modification 4 was produced and the RA value and MR ratio thereof were evaluated. That is, a structure in which the function layer 21 was provided inside the upper pin layer 143 as shown in FIG. 7 was produced.

Undercoating Layer 12: Ta [1 nm]/Ru [2 nm]
Pinning Layer 13: $Ir_{22}Mn_{78}$ [7 nm]
Pin Layer 14: $Co_{90}Fe_{10}$ [4.4 nm]/Ru [0.9 nm]/$Fe_{50}Co_{50}$ [1 nm]
Function Layer 21: Zn—$Fe_{50}Co_{50}$—O [3 nm]
Pin Layer 143B: $Fe_{50}Co_{50}$ [1 nm]
Spacer Layer 16: Cu [3 nm]
Free Layer 18: $Fe_{50}Co_{50}$ [4 nm]

The RA of the magneto-resistance effect device 10 according to this example was $0.2\Omega\mu m^2$, and the MR ratio thereof was 2.8%.

Example 6

A magneto-resistance effect device 10 according to Modification 5 was produced and the RA value and MR ratio thereof were evaluated. That is, a structure in which the function layer 21 was provided between the upper pin layer 143 and the magnetic coupling layer 142 as shown in FIG. 8 was produced.

Undercoating Layer 12: Ta [1 nm]/Ru [2 nm]
Pinning Layer 13: $Ir_{22}Mn_{78}$ [7 nm]
Pin Layer 14: $Co_{90}Fe_{10}$ [4.4 nm]/Ru [0.9 nm]
Function Layer 21: Zn—$Fe_{50}Co_{50}$—O [3 nm]
Pin Layer 143B: $Fe_{50}Co_{50}$ [2 nm]
Spacer Layer 16: Cu [3 nm]
Free Layer 18: $Fe_{50}Co_{50}$ [4 nm]

The RA of the magneto-resistance effect device 10 according to this example was $0.2\Omega\mu m^2$, and the MR ratio thereof was 2.5%.

Example 7

A magneto-resistance effect device 10 according to Modification 6 was produced and the RA value and MR ratio thereof were-evaluated. That is, a structure in which the function layer 22 was provided between the free layer 18 and the spacer layer 16 and the function layer 21 was provided between the spacer layer 16 and the upper pin layer 143 as shown in FIG. 9 was produced.

Undercoating Layer 12: Ta [1 nm]/Ru [2 nm]
Pinning Layer 13: $Ir_{22}Mn_{78}$ [7 nm]
Pin Layer 14: $Co_{90}Fe_{10}$ [4.4 nm]/Ru [0.9 nm]/$Fe_{50}Co_{50}$ [2 nm]
Function Layer 21: Zn—$Fe_{50}Co_{50}$—O [3 nm]
Spacer Layer 16: Cu [3 nm]
Function Layer 22: Zn—$Fe_{50}Co_{50}$—O [3 nm]
Free Layer 18: $Fe_{50}Co_{50}$ [2 nm]

The RA of the magneto-resistance effect device 10 according to this example was $0.2\Omega\mu m^2$, and the MR ratio thereof was 4.2%.

Comparative Example 1

A magneto-resistance effect device using no function layer was produced and the RA value and MR ratio thereof were evaluated.

Undercoating Layer 12: Ta [1 nm]/Ru [2 nm]
Pinning Layer 13: $Ir_{22}Mn_{78}$ [7 nm]
Pin Layer 14: $Co_{90}Fe_{10}$ [4.4 nm]/Ru [0.9 nm]/$Fe_{50}Co_{50}$ [4 nm]
Spacer Layer 16: Cu [3 nm]
Free Layer 18: $Fe_{50}Co_{50}$ [4 nm]

The RA of the magneto-resistance effect device 10 according to this example was $0.08\Omega\mu m^2$, and the MR ratio thereof was 1.5%.

Each of the MR ratios of the magneto-resistance effect devices 10 according to Examples 1 to 7 exhibits a larger value than the MR ratio in Comparative Example 1. It can be known that the MR ratio can be improved when any one of the magneto-resistance effect devices 10 according to the first embodiment and Modifications 1 to 6 is used.

As for the reason why the MR ratio is improved, it is considered that the function layer can make a high spin filter effect and reduction of spin-flip due to achievement of low resistivity consistent with each other. Because the spin filtering layer of oxide is apt to be a high resistivity material, resistance is apt to be high. Generally, when electrons pass through a high resistance layer, spin-flip by which spin information is lost occurs easily. When spin-flip occurs, the MR ratio decreases. When spin-flip is reduced in the spin filtering layer of oxide, there is further room for increasing the MR ratio.

Second Embodiment

Figure 12A:
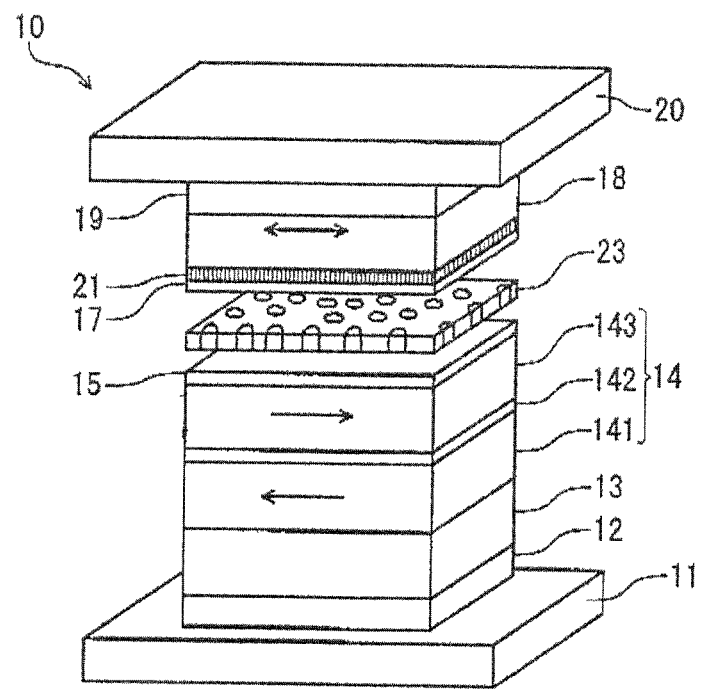
FIG. 12A is a view showing the configuration of a magnet-resistance effect device according to a second embodiment of the invention.

FIG. 12A is a view showing the configuration of a magnet-resistance effect device 10 according to a second embodiment of the invention.

The magnet-resistance effect device 10 according to this embodiment is different from the magnet-resistance effect device 10 according to the first embodiment in that a Current-confined-to-the-path layer 23 sandwiched between an upper electrode 17 and a lower electrode 15 is provided between the upper pin layer 143 and the cap layer 19. That is, the spacer layer 16 according to the first embodiment is equivalent to the Current-confined-to-the-path layer 23, and the Current-confined-to-the-path layer 23 is sandwiched between the upper electrode 17 and the lower electrode 15. Incidentally, the Current-confined-to-the-path layer 23 is equivalent to the spacer layer 16 as a constituent member of the magneto-resistance effect device 10 according to the first embodiment but different from the spacer layer 16 in that current paths 24 are formed in the Current-confined-to-the-path layer 23.

Figure 12B:
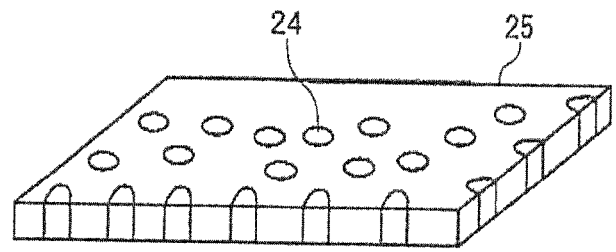
FIG. 12B is a view showing the configuration of a Current-confined-to-the-path layer.

FIG. 12B is a view showing the configuration of the Current-confined-to-the-path layer 23.

The Current-confined-to-the-path layer 23 is made of an insulating layer 25. Current paths 24 through which a current passes are formed in the insulating layer 25.

Description about the same configuration as that described in the first embodiment will be omitted here.

A lower metal layer 15 is used for forming the current paths 24 in the Current-confined-to-the-path layer 23. The lower metal layer 15 has also a function of suppressing oxidation of the upper pin layer 143 located under the lower metal layer 15 when the insulating layer 23 forming the Current-confined-to-the-path layer 25 is formed. A metal such as Cu, Au or Ag can be used as the lower metal layer 15.

The Current-confined-to-the-path layer 23 has a function of magnetically decoupling the pin layer 14 and the free layer 18 from each other, and also a function of making a current pass through the current paths 24 between the pin layer 14 and the free layer 18.

The insulating layer 25 forming the Current-confined-to-the-path layer 23 is made of oxide, nitride, oxynitride, or the like. Specifically, Ti oxide, Hf oxide, Mn oxide, Zr oxide, Cr oxide, Ta oxide, Nb oxide, Mo oxide, Si oxide, V oxide, etc. or nitride or oxynitride having Al, Si, Hf, Ti, Mg, Zr, V, Mo, Nb, Ta, W, B or C as a base can be used. As a typical material, $Al_2O_3$ and a material obtained by adding an additive element thereto can be used. Examples of the additive element are Ti, Hf, Mg, Zr, V, Mo, Si, Cr, Nb, Ta, W, B, C, etc. As for the amounts of these additive elements to be added, each additive element in a range of 0% to 50% can be added to the insulating layer 25.

The current paths 24 forming the current-confined-to-the-path layer 23 have a function of making a current pass through perpendicularly to the film plane of the magneto-resistance effect device 10 to thereby narrow the Current. Accordingly, the MR ratio of the magneto-resistance effect device 10 can be improved. As the current paths 24, Cu, Au, Ag, Ni, Co, Fe or an alloy containing at least one of these elements can be used. Specifically, AlCu, CuNi, CuCo, CuFe, or the like, can be used. Here, to reduce an interlayer coupling field (Hin) between the pin layer 14 and the free layer 18, it is preferable that the Cu content is not smaller than 50% when an alloy containing Cu is used.

When FeCo having an fcc structure or a bcc structure is used as the insulating layer 25 in the case where the current paths 24 are made from a material containing Cu in this manner, the MR ratio may be further improved. Specifically, Fe, $Co_{100-x}$ (x=30% to 100%) or a material obtained by adding an additive element such as Ti, Hf, Mg, Zr, V, Mo, Si, Cr, Nb, Ta, W, B or C thereto can be used. $Co_{50}Fe_{50}$ [1 nm]/ $Ni_{85}Fe_{15}$ [3.5 nm] can be used.

Although it is preferable that the same material is used as the material of the current paths 24 and the material of the lower metal layer 15, the material of the current paths 24 may be different from the material of the lower metal layer 15 when the constituent material of the current paths 24 is a magnetic material.

Incidentally, it is preferable from the viewpoint of magnetic decoupling that the film thickness of the Current-confined-to-the-path layer 23 is not smaller than 1 nm and not larger than 3 nm, and it is more preferable that the film thickness of the Current-confined-to-the-path layer 23 is not smaller than 1.5 nm and not larger than 2.5 nm.

The upper metal layer 17 serves as a barrier layer for restraining oxygen and nitrogen forming the Current-confined-to-the-path layer 23 from being diffused into the free layer 18, and also as a seed layer for improving the crystallinity of the free layer 18. Specifically, the upper metal layer 17 is provided so that the free layer 18 formed on the upper metal layer 17 suppresses oxidation or nitriding of the insulating layer 25 forming the Current-confined-to-the-path layer 23.

It is preferable that the material of the upper metal layer 17 is the same as the material of the current paths 24 forming the Current-confined-to-the-path layer 23. This is because increase in interfacial resistance is suppressed when the material of the upper metal layer 17 is the same as the material of the current paths 24 though increase in interfacial resistance is caused when the two materials are different from each other. Incidentally, when the constituent material of the current paths 24 is a magnetic material, the material may be the same as the magnetic material of the free layer or may be different from the magnetic material of the free layer. As the constituent material of the upper metal layer 17, Cu, Au, Ag or the like can be used. When the insulating layer 25 forming the Current-confined-to-the-path layer 23 is made of amorphous $Al_2O_3$, the crystallinity of the upper metal layer 17 formed on the Current-confined-to-the-path layer 23 becomes poor but the crystallinity of the free layer 18 can be made good when a very thin seed layer of Cu or the like with a thickness of about 0.25 nm is provided between the Current-confined-to-the-path layer 23 and the upper metal layer 17.

A method of manufacturing the magneto-resistance effect device 10 according to this embodiment will be described below with reference to a flow chart shown in FIG. 13.

Figure 13:
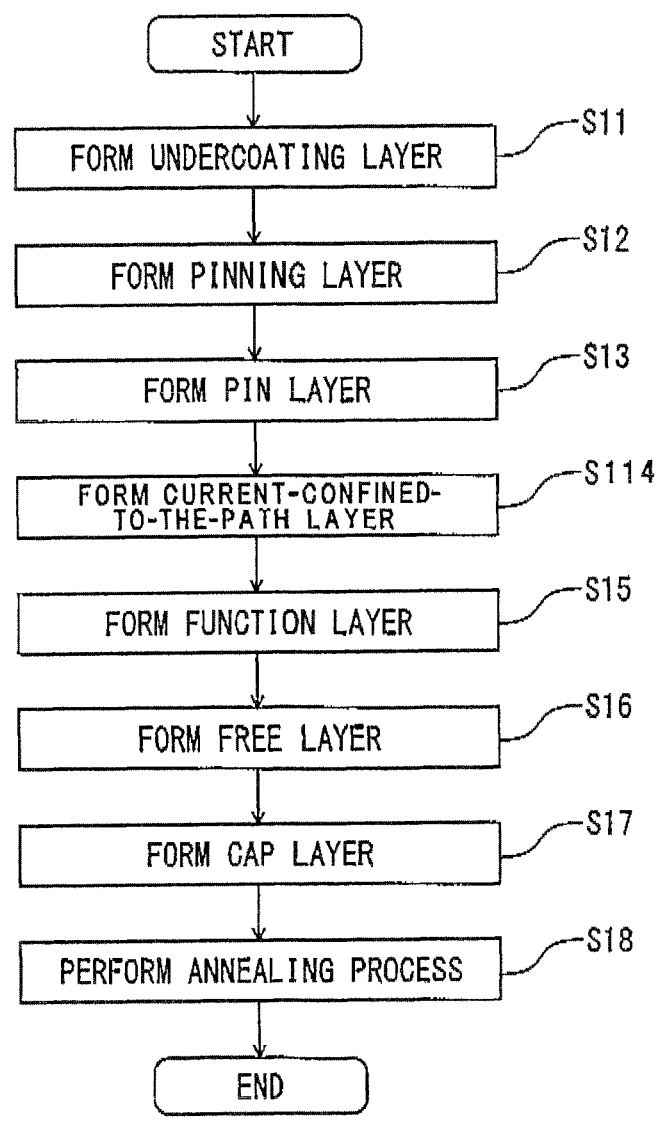
FIG. 13 is a flow chart for explaining a method of manufacturing the magnet-resistance effect device according to the second embodiment.

Step S114 shown in FIG. 13 is different from the method of manufacturing the magneto-resistance effect device 10 described in the first embodiment with reference to FIG. 3. Since the other steps S11 to S13 and S15 to S18 are the same as those in the method of manufacturing the magneto-resistance effect device 10 according to the first embodiment, description thereof will be omitted.

In step S114, an insulating layer 25 having current paths 24 is formed on the upper pin layer 143. Description will be made here in the case where the Current-confined-to-the-path layer 23 including the current paths 24 made of Cu is formed in the insulating layer 25 made of Al$_2$O$_3$ having an amorphous structure, by way of example.

First, after a lower metal layer 15 of Cu is formed, a metal layer of AlCu is formed on the lower metal layer 15.

Then, the metal layer is irradiated with an ion beam of rare gas such as Ar, Xe, Kr or He to perform preprocessing.

This processing is called PIT (Pre-ion Treatment). As a result of the PIT, a part of the lower metal layer 15 is sucked up and forcibly enters the metal layer.

Then, while the metal layer is irradiated with an ion beam of rare gas such as Ar, Xe, Kr or He, oxidizing gas such as O$_2$ is supplied to oxidize the metal layer. By this oxidation, the metal layer is converted into the insulating layer 25 of Al$_2$O$_3$, and the current paths 24 piercing the insulating layer 25 are formed so that the Current-confined-to-the-path layer 23 can be formed. This method is called IAO (Ion Assisted Oxidation). This is a process using an oxidation energy difference that Al is easily oxidizable but Cu is hardly oxidizable.

(Modification 7)

Figure 14:
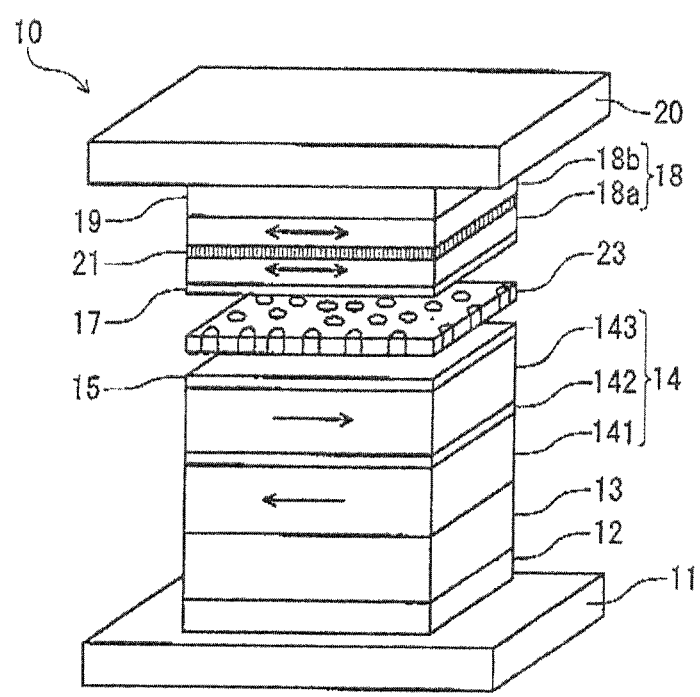
FIG. 14 is a view showing the configuration of a magneto-resistance effect device according to a seventh modification.

FIG. 14 is a view showing a seventh modification of the magneto-resistance effect device 10 according to the second embodiment.

This modification is different from the second embodiment in that the function layer 21 is provided inside the free layer 18. That is, the free layer 18 includes a first free layer 18a and a second free layer 18b. Incidentally, the first free layer 18a is provided between the upper metal layer 17 and the function layer 21, and the second free layer 18b is provided between the cap layer 19 and the function layer 21.

When the function layer 21 is provided inside the free layer 18 in this manner, the function layer 21 contributes to spin-dependent bulk scattering as described above. Because oxygen contained in the function layer 21 is restrained from being diffused into the metal paths of the Current-confined-to-the-path layer 23 when the function layer 21 is disposed in a position being not in contact with the spacer layer, increase in resistivity of the metal paths as caused by the presence of any oxygen element in the Current-confined-to-the-path layer 23 can be avoided so that a high MR ratio can be obtained. Incidentally, because the magnetization direction of the function layer 21 is free in the same manner as in Modification 1, the function layer 21 contributes to improvement in the MR ratio of the magneto-resistance effect device 10 without inhibition of the function of the free layer 18.

(Modification 8)

Figure 15:
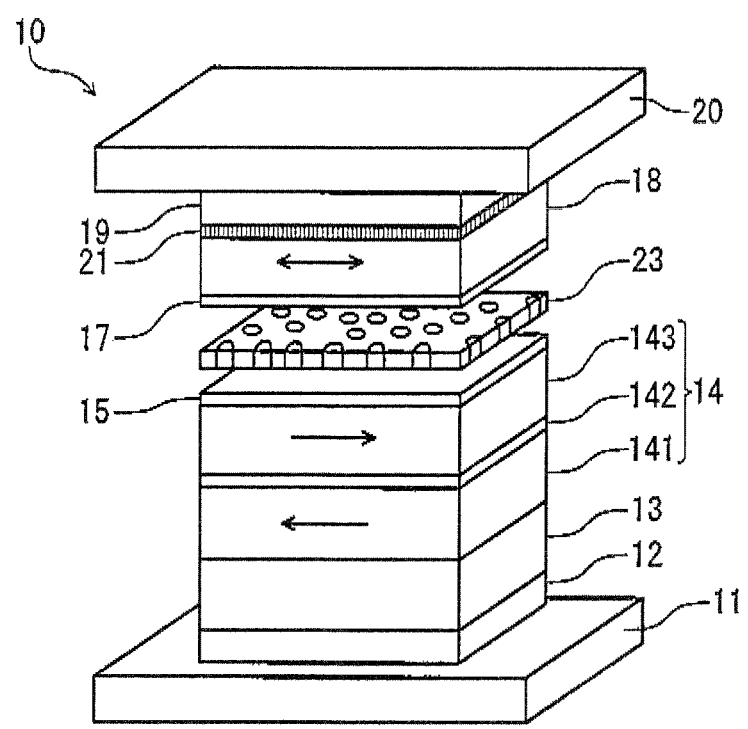
FIG. 15 is a view showing the configuration of a magneto-resistance effect device according to an eighth modification.

FIG. 15 is a view showing an eighth modification of the magneto-resistance effect device 10 according to the second embodiment.

This modification is different from the second embodiment in that the function layer 21 is provided between the free layer 18 and the cap layer 19.

When the function layer 21 is provided between the free layer 18 and the cap layer 19 in this manner, the function layer 21 contributes to spin-dependent bulk scattering as described above. Because oxygen contained in the function layer 21 is restrained from being diffused into the metal paths of the Current-confined-to-the-path layer 23 when the function layer 21 is disposed in a position being not in contact with the metal layer 15, the Current-confined-to-the-path layer 23 and the metal layer 17, increase in resistivity of the metal paths as caused by the presence of any oxygen element in the current-confined-to-the-path layer 23 can be avoided so that a high MR ratio can be obtained. Moreover, the function layer 21 can prevent the magneto-resistance effect device 10 from deterioration such as oxidation.

(Modification 9)

Figure 16:
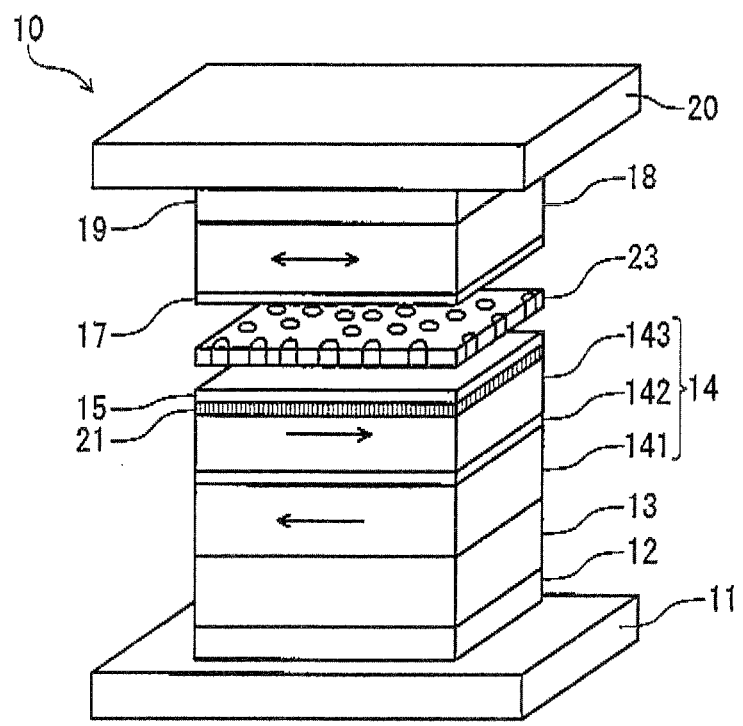
FIG. 16 is a view showing the configuration of a magneto-resistance effect device according to a ninth modification.

FIG. 16 is a view showing a ninth modification of the magneto-resistance effect device 10 according to the second embodiment.

This modification is different from the second embodiment in that the function layer 21 is provided between the upper pin layer 143 and the lower metal layer 15.

When the function layer 21 is provided between the upper pin layer 143 and the lower metal layer 15 in this manner, the function layer 21 contributes to spin-dependent interfacial scattering as described above. Moreover, because the function layer 21 can prevent the constituent material of the metal layer 15 and the constituent material of the upper pin layer 143 from being mixed with each other, the constituent material of the upper pin layer 143 is hardly mixed in the metal paths forming the Current-confined-to-the-path layer 23. As a result, conduction electrons can pass through the Current-confined-to-the-path layer 23 while spin-flip is suppressed, so that the magnetization of the upper pin layer 143 can be fixed stably.

(Modification 10)

Figure 17:
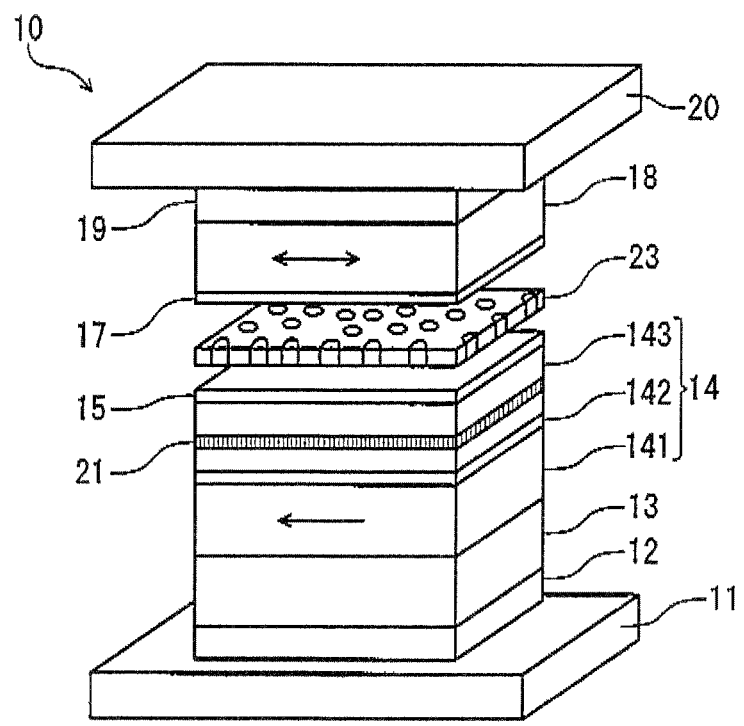
FIG. 17 is a view showing the configuration of a magneto-resistance effect device according to a tenth modification.

FIG. 17 is a view showing a tenth modification of the magneto-resistance effect device 10 according to the second embodiment.

This modification is different from the second embodiment in that the function layer 21 is provided inside the upper pin layer 143.

When the function layer 21 is provided inside the upper pin layer 143 in this manner, the function layer 21 contributes to spin-dependent bulk scattering as described above. Because oxygen contained in the function layer 21 is restrained from being diffused into the metal paths of the Current-confined-to-the-path layer 23 when the function layer 21 is disposed in a position being not in contact with the metal layer 15, the Current-confined-to-the-path layer 23 and the metal layer 17, increase in resistivity of the metal paths as caused by the presence of any oxygen element in the Current-confined-to-the-path layer 23 can be avoided so that a high MR ratio can be obtained.

(Modification 11)

Figure 18:
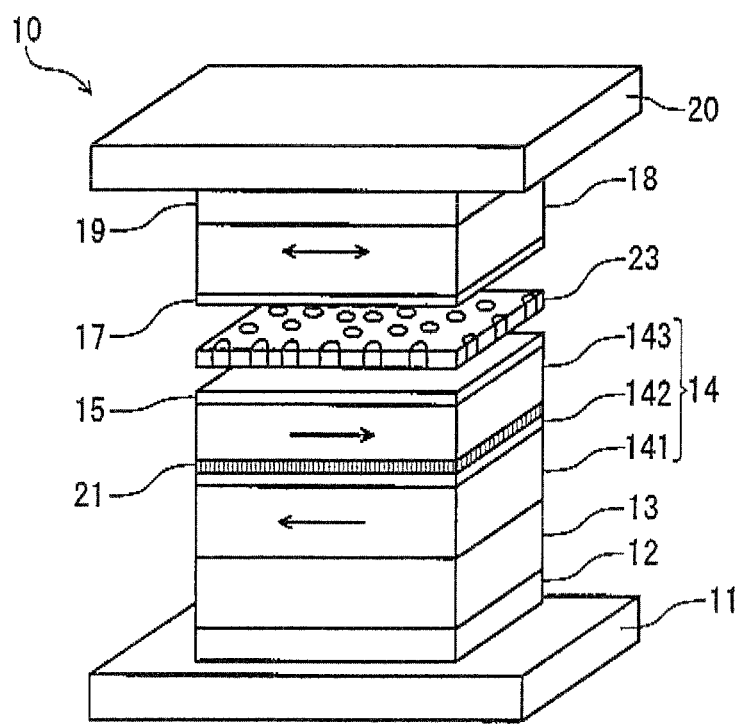
FIG. 18 is a view showing the configuration of a magneto-resistance effect device according to an eleventh modification.

FIG. 18 is a view showing an eleventh modification of the magneto-resistance effect device 10 according to the second embodiment.

This modification is different from the second embodiment in that the function layer 21 is provided between the upper pin layer 143 and the magnetic coupling layer 142.

When the function layer 21 is provided between the upper pin layer 143 and the magnetic coupling layer 142 in this manner, the function layer 21 contributes to spin-dependent bulk scattering as described above. Because oxygen contained in the function layer 21 is restrained from being diffused into the metal paths of the Current-confined-to-the-path layer 23 when the function layer 21 is disposed in a position being not in contact with the metal layer 15, the Current-confined-to-the-path layer 23 and the metal layer 17, increase in resistivity of the metal paths as caused by the presence of any oxygen element in the Current-confined-to-the-path layer 23 can be avoided so that a high MR ratio can be obtained.

(Modification 12)

Figure 19:
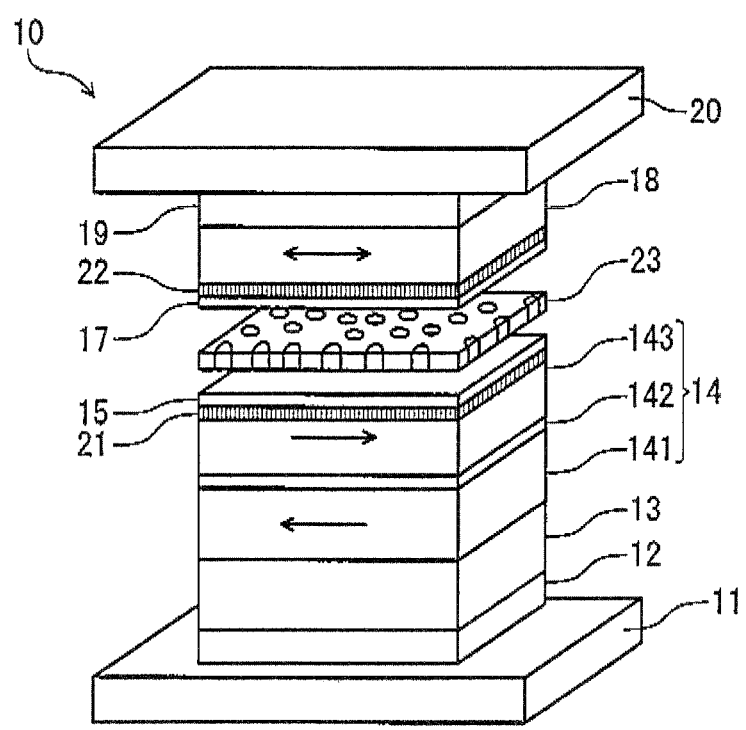
FIG. 19 is a view showing the configuration of a magneto-resistance effect device according to a twelfth modification.

FIG. 19 is a view showing a twelfth modification of the magneto-resistance effect device 10 according to the second embodiment.

This modification is different from the second embodiment in that a second function layer 22 is further provided between the upper metal layer 17 and the free layer 18 in addition to the function layer 21 provided between the upper pin layer 143 and the lower metal layer 15.

When the second function layer 22 is further provided between the upper metal layer 17 and the free layer 18 in addition to the function layer 21 provided between the upper pin layer 143 and the lower metal layer 15 in this manner, an effect as the sum of spin filtering effects of the two function layers can be obtained so that a high MR ratio can be obtained in comparison with the case where one function layer is used.

Incidentally, because the magnet-resistance effect devices 10 according to the aforementioned modifications 7 to 12 can be produced by use of the methods of manufacturing the magnet-resistance effect devices 10 described in the first and second embodiments, description about the method of manufacturing the magneto-resistance effect devices 10 according to the modifications 7 to 12 will be omitted.

EXAMPLES

Magneto-resistance effect devices 10 according to the second embodiment and the modifications 7 to 12 were produced and perpendicular current conduction was performed between the electrodes 11 and 20 so that the RA values and MR ratios of the magneto-resistance effect devices 10 were evaluated.

Example 8

A magneto-resistance effect device 10 according to the second embodiment was produced and the RA value and MR ratio thereof were evaluated. That is, a structure in which the function layer 21 was provided between the free layer 18 and the metal layer 17 as shown in FIG. 12A was produced.
Undercoating Layer 12: Ta [1 nm]/Ru [2 nm]
Pinning Layer 13: $Ir_{22}Mn_{78}$ [7 nm]
Pin Layer 14: $Co_{75}Fe_{25}$ [3.9 nm]/Ru [0.9 nm]/$Fe_{50}Co_{50}$ [1.8 nm]/Cu [0.25 nm]/$Fe_{50}Co_{50}$ [1.8 nm]
Metal Layer 15: Cu [0.6 nm]
Current-confined-to-the-path layer 23: Insulating Layer 161 of $Al_2O_3$ and Current Paths 162 of Cu
Metal Layer 17: Cu [0.4 nm]
Function Layer 21: Zn—$Fe_{50}Co_{50}$—O [2 nm]
Free Layer 18: $Ni_{83}Fe_{17}$ [3.5 nm]
The RA of the magneto-resistance effect device 10 according to this example was 0.3Ωμm$^2$, and the MR ratio thereof was 15%.

Example 9

A magneto-resistance effect device 10 according to Modification 7 was produced and the RA value and MR ratio thereof were evaluated. That is, a structure in which the function layer 21 was provided inside the free layer 18 as shown in FIG. 14 was produced.
Undercoating Layer 12: Ta [1 nm]/Ru [2 nm]
Pinning Layer 13: $Ir_{22}Mn_{78}$ [7 nm]
Pin Layer 14: $Co_{75}Fe_{25}$ [3.9 nm]/Ru [0.9 nm]/$Fe_{50}Co_{50}$ [1.8 nm]/Cu [0.25 nm]/$Fe_{50}Co_{50}$ [1.8 nm]
Metal Layer 15: Cu [0.6 nm]
Current-confined-to-the-path layer 23: Insulating Layer 161 of $Al_2O_3$ and Current Paths 162 of Cu
Metal Layer 17: Cu [0.4 nm]
Free Layer 18A: $Fe_{50}Co_{50}$ [1 nm]
Function Layer 21: Zn—$Fe_{50}Co_{50}$—O [1 nm]
Free Layer 18: $Ni_{83}Fe_{17}$ [3.5 nm]
The RA of the magneto-resistance effect device 10 according to this example was 0.33Ωμm$^2$, and the MR ratio thereof was 14.5%.

Example 10

A magneto-resistance effect device 10 according to Modification 8 was produced and the RA value and MR ratio thereof were evaluated. That is, a structure in which the function layer 21 was provided between the cap layer 19 and the free layer 18 as shown in FIG. 15 was produced.
Undercoating Layer 12: Ta [1 nm]/Ru [2 nm]
Pinning Layer 13: $Ir_{22}Mn_{78}$ [7 nm]
Pin Layer 14: $Co_{75}Fe_{25}$ [3.9 nm]/Ru [0.9 nm]/$Fe_{50}Co_{50}$ [1.8 nm]/Cu [0.25 nm]/$Fe_{50}Co_{50}$ [1.8 nm]
Metal Layer 15: Cu [0.6 nm]
Current-confined-to-the-path layer 23: Insulating Layer 161 of $Al_2O_3$ and Current Paths 162 of Cu
Metal Layer 17: Cu [0.4 nm]
Free Layer 18: $Fe_{50}Co_{50}$ [1 nm]/$Ni_{89}Fe_{17}$ [3.5 nm]
Function Layer 21: Zn—$Fe_{50}Co_{50}$—O [1 nm]
The RA of the magneto-resistance effect device 10 according to this example was 0.3 m$^2$, and the MR ratio thereof was 14%.

Example 11

A magneto-resistance effect device 10 according to Modification 9 was produced and the RA value and MR ratio thereof were evaluated. That is, a structure in which the function layer 21 was provided between the metal layer 15 and the upper pin layer 143 as shown in FIG. 16 was produced.
Undercoating Layer 12: Ta [(1 nm]/Ru [2 nm]
Pinning Layer 13: $Ir_{22}Mn_{78}$ [7 nm]
Pin Layer 14; $Co_{75}Fe_{25}$ [3.9 nm]/Ru [0.9 nm]/$Fe_{50}Co_{50}$ [1.8 nm]/Cu [0.25 nm]
Function Layer 21: Zn—$Fe_{50}Co_{50}$—O [2 nm]
Metal Layer 15: Cu [0.6 nm]
Current-confined-to-the-path layer 23: Insulating Layer 161 of $Al_2O_3$ and Current Paths 162 of Cu
Metal Layer 17: Cu [0.4 nm]
Free Layer 18: $Fe_{50}Co_{50}$ [2 nm]/$Ni_{83}Fe_{17}$ [3.5 nm]
The RA of the magneto-resistance effect device 10 according to this example was 0.35Ωμm$^2$, and the MR ratio thereof was 14.5%.

Example 12

A magneto-resistance effect device 10 according to Modification 10 was produced and the RA value and MR ratio thereof were evaluated. That is, a structure in which the function layer 21 was provided inside the upper pin layer 143 as shown in FIG. 17 was produced.
Undercoating Layer 12: Ta [1 nm]/Ru [2 nm]
Pinning Layer 13: $Ir_{22}Mn_{78}$ [7 nm]
Pin Layer 14: $Co_{75}Fe_{25}$ [3.9 nm]/Ru [0.9 nm]/$Fe_{50}Co_{50}$ [1.8 nm]/Cu [0.25 nm]
Function Layer 21: Zn—$Fe_{50}Co_{50}$—O [1 nm]
Pin Layer 143B: $Fe_{50}Co_{50}$ [1 nm]
Metal Layer 15: Cu [0.6 nm]
Current-confined-to-the-path layer 23: Insulating Layer 161 of $Al_2O_3$ and Current Paths 162 of Cu
Metal Layer 17: Cu [0.4 nm]
Free Layer 18: $Fe_{50}Co_{50}$ [2 nm]/$Ni_{83}Fe_{17}$ [3.5 nm]
The RA of the magneto-resistance effect device 10 according to this example was 0.31Ωμm$^2$, and the MR ratio thereof was 14.5%.

Example 13

A magneto-resistance effect device 10 according to Modification 11 was produced and the RA value and MR ratio thereof were evaluated. That is, a structure in which the function layer 21 was provided between the upper pin layer 143 and the magnetic coupling layer 142 as shown in FIG. 18 was produced.

Undercoating Layer 12: Ta [1 nm]/Ru [2 nm]
Pinning Layer 13: $Ir_{22}Mn_{78}$ [7 nm]
Pin Layer 14: $Co_{75}Fe_{25}$ [3.9 nm]/Ru [0.9 nm]/$Fe_{50}Co_{50}$ [1 nm]
Function Layer 21: Zn—$Fe_{50}Co_{50}$—O [1 nm]
Pin Layer 143B: Cu [0.25 nm]/$Fe_{50}Co_{50}$ [1.8 nm]
Metal Layer 15: Cu [0.6 nm]
Current-confined-to-the-path layer 23: Insulating Layer 161 of $Al_2O_3$ and Current Paths 162 of Cu
Metal Layer 17: Cu [0.4 nm]
Free Layer 18: $Fe_{50}Co_{50}$ [2 nm]/$Ni_{83}Fe_{17}$ [3.5 nm]

The RA of the magneto-resistance effect device 10 according to this example was $0.31\Omega\mu m^2$, and the MR ratio thereof was 13.8%.

Example 14

A magneto-resistance effect device 10 according to Modification 12 was produced and the RA value and MR ratio thereof were evaluated. That is, a structure in which the function layer 21 was provided between the free layer 18 and the metal layer 17, and the function layer 22 is provided between the metal layer 15 and the upper pin layer 143 as shown in FIG. 19 was produced.

Undercoating Layer 12: Ta [1 nm]/Ru [2 nm]
Pinning Layer 13: $Ir_{22}Mn_{78}$ [7 nm]
Pin Layer 14: $Co_{71}Fe_{25}$ [3.9 nm]/Ru [0.9 nm]/$Fe_{50}Co_{50}$ [1.8 nm]/Cu [0.25 nm]
Function Layer 21: Zn—$Fe_{50}Co_{50}$—O [2 nm]
Metal Layer 15: Cu [0.6 nm]
Current-confined-to-the-path layer 23: Insulating Layer 161 of $Al_2O_3$ and Current Paths 162 of Cu
Metal Layer 17; Cu [0.4 nm]
Function Layer 21: Zn—$Fe_{50}Co_{50}$—O [2 nm]
Free Layer 18: $Ni_{83}Fe_{17}$ [3.5 nm]

The RA of the magneto-resistance effect device 10 according to this example was $0.45\Omega\mu m^2$, and the MR ratio thereof was 16%.

Comparative Example 2

A magneto-resistance effect device using no function layer was produced and the RA value and MR ratio thereof were evaluated. This magneto-resistance effect device is different from the magneto-resistance effect device according to Comparative Example 1 in that the spacer layer has an insulating layer sandwiched between two metal layers and current paths piercing the insulating layer.

Undercoating Layer 12: Ta [1 nm]/Ru [2 nm]
Pinning Layer 13: $Ir_{22}Mn_{78}$ [7 nm]
Pin Layer 14: $Co_{75}Fe_{25}$ [3.9 nm]/Ru [0.9 nm]/$Fe_{50}Co_{50}$ [1.8 nm]/Cu [0.25 nm]/$Fe_{50}Co_{50}$ [1.8 nm]
Function Layer 21: Zn—$Fe_{50}Co_{50}$—O [2 nm]
Metal Layer 15: Cu [0.6 nm]
Current-confined-to-the-path layer 23: Insulating Layer 161 of $Al_2O_3$ and Current Paths 162 of Cu
Metal Layer 17: Cu [0.4 nm]
Free Layer 18: $Fe_{50}Co_{50}$ [2 nm]/$Ni_{83}Fe_{17}$ [3.5 nm]

The RA of the magneto-resistance effect device 10 according to this example was $0.28\Omega\mu m^2$, and the MR ratio thereof was 12.5%.

It was confirmed that each of the MR ratios of the magneto-resistance effect devices 10 according to Examples 8 to 14 exhibits a larger value than the MR ratio in Comparative Example 2. The MR ratio can be improved when any one of the magneto-resistance effect devices 10 according to the second embodiment and Modifications 7 to 12 is used.

Examples 15 to 17 and Comparative Examples 2 and 3

As for the magneto-resistance effect device 10 shown in FIG. 1 as described in the first embodiment, oxygen exposure was changed so that the RA value of the magneto-resistance effect device and resistivity of the function layer forming the magneto-resistance effect device were changed. Further, the influence of the RA value of the magneto-resistance effect device and the resistivity of the function layer on the MR ratio was examined.

The magneto-resistance effect device 10 according to this example includes: a multilayer structure having a cap layer 19 which prevents the magneto-resistance effect device 10 from deterioration such as oxidation, a pin layer 14 in which magnetization is fixed, a free layer 18 which is provided between the cap layer 19 and the pin layer 14 so that magnetization rotates freely, a spacer layer 16 made of a nonmagnetic substance provided between the pin layer 14 and the free layer 18, and a function layer 21 provided between the spacer layer 16 and the free layer 18 and containing mixed oxide of any one element of Zn, In, Sn and Cd and any one element of Fe, Co and Ni; a pair of electrodes 11 and 20 for applying a current perpendicularly to a film plane of the multilayer structure; a pinning layer 13 provided between the electrode 11 and the pin layer 14 and made of an antiferromagnetic substance for fixing the magnetization direction of the pin layer; and an undercoating layer 12 provided between the pinning layer 13 and the electrode 11.

The structure of the magneto-resistance effect device 10 produced according to this example will be described as follows.

Undercoating Layer 12: Ta [1 nm]/Ru [2 nm]
Pinning Layer 13: $Ir_{22}Mn_{78}$ [7 nm]
Pin Layer 14: $Co_{90}Fe_{10}$ [4.4 nm]/Ru [0.9 nm]/$Fe_{50}Co_{50}$ [4 nm]
Spacer Layer 16: Cu [3 nm]
Function Layer 21: Zn—$Fe_{50}Co_{50}$—O [2 nm]
Free Layer 18: $Fe_{50}Co_{50}$ [3 nm]

As for the method of producing the function layer, 1 nm-thick $Fe_{50}Co_{50}$ was formed on a spacer layer of Cu, and 0.6 nm-thick Zn was formed thereon. Then, this $Fe_{50}Co_{50}$ and Zn were converted into oxide of Zn and $Fe_{50}Co_{50}$ (hereinafter referred to as Zn—$Fe_{50}Co_{50}$-O) by IAO to thereby form a function layer. Oxygen exposure used in IAO was changed. On this occasion, the oxygen exposure was set to be $1.2\times10^4$ Langmiur in Example 15, $1.5\times10^4$ Langmiur in Example 16, and $1.8\times10^4$ Langmiur in Example 17. The oxygen exposure was set to be $3.0\times10^4$ Langmiur in Comparative Example 3. Incidentally, in Examples 1 to 14, the film thickness of the function layer was so large that the oxygen exposure was set to be a little higher than Examples 15 to 17.

FIG. 20 is a view showing results of the MR ratio of the function layer when oxygen exposure used in IAO was changed to thereby change the RA value of the magneto-resistance effect device and the resistivity of the function layer made of Zn—$Fe_{50}Co_{50}$—O. Incidentally, a result (corresponding to Comparative Example 2) of measurement of a magneto-resistance effect device having no function layer is also shown for reference.

The resistivity $\rho_{Zn-FeCo-O}$ of the function layer was calculated according to the following expression 1 when the resistivity of the function layer is $\rho_{Zn-Fe50Co50-O}$, the film thickness of the function layer is $t_{Zn-FeCo-O}$, and the increasing amount of areal resistance of the magneto-resistance effect device due to the provision of the function layer is $\Delta RA_{Zn-FeCo-O}$.

[Numeral 1]

$$\rho_{Zn-Fe_{50}Co_{50}-O} = \frac{\Delta RA_{Zn-Fe_{50}Co_{50}-O}}{t_{Zn-Fa_{50}Co_{50}-O}} \quad \text{(Expression 1)}$$

When the film thickness of the function layer was obtained from a cross-sectional TEM observation image, the film thickness of the function layer according to any one of Examples 15, 16 and 17 and Comparative Example 3 was 2 nm. Incidentally, the value of $\Delta RA$ uses a difference between the RA value of the magneto-resistance effect device not provided with any function layer (Comparative Example 2 in FIG. 20) and the RA value of the magneto-resistance effect device provided with the function layer.

It can be known from FIG. 20 that the MR ratio is improved when the resistivity of the function layer is not higher than $5 \times 10^4$ $\mu\Omega$cm. It can be also known that the MR ratio is improved when the RA value of the magneto-resistance effect device is not higher than 1 $\mu\Omega$cm.

It can be considered that the aforementioned results are obtained because spin-flip inside the function layer 21 can be suppressed when the function layer 21 of low resistivity is produced by use of an appropriate oxygen exposure.

Third Embodiment

A magnetic head using a magneto-resistance effect device 10 according to this embodiment will be described below.

Figure 21:
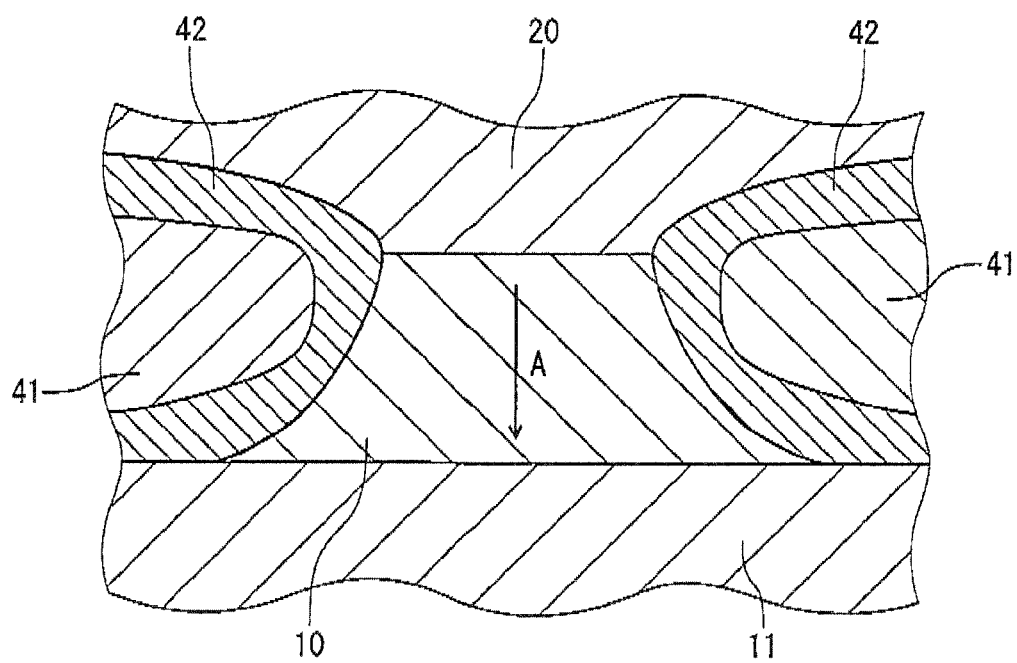
FIG. 21 is a view showing the configuration of a magnetic head according to a third embodiment.
Figure 22:
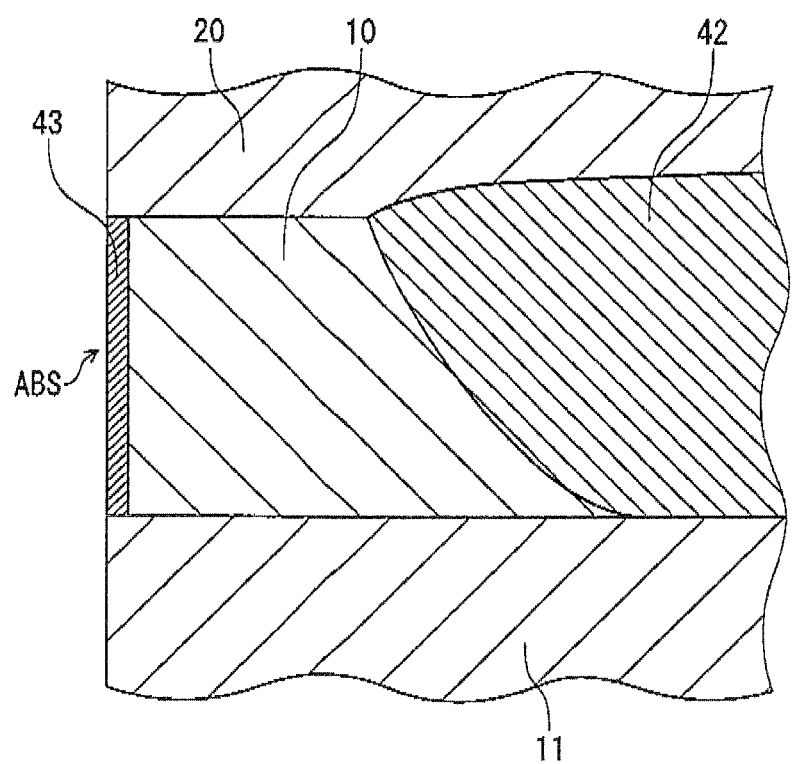
FIG. 22 is a view showing the configuration of the magnetic head.

FIGS. 21 and 22 are views showing a state where a magneto-resistance effect device 10 according to this embodiment is incorporated in a magnetic head. FIG. 21 is a sectional view of the magneto-resistance effect device 10 taken in a direction substantially parallel to a medium facing surface which faces a magnetic recording medium (not shown). FIG. 22 is a sectional view of the magneto-resistance effect device 10 taken in a direction perpendicular to the medium facing surface ABS.

The magnetic head illustrated in FIGS. 21 and 22 has a so-called hard abutted structure. Electrodes 11 and 20 are provided on upper and lower sides of the magneto-resistance effect device 10, respectively. In FIG. 21, a laminate of a bias magnetic field application film 41 and an insulating film 42 is provided on each of opposite sides of the magneto-resistance effect device 10. As shown in FIG. 22, a protective layer 43 is provided on the medium facing surface of the magneto-resistance effect device 10.

A sense current for the magneto-resistance effect device 10 is poured in a direction substantially perpendicular to the film plane by the electrodes 11 and 20 on the upper and lower sides, as represented by the arrow A. A bias magnetic field is applied to the magneto-resistance effect device 10 by the pair of bias magnetic field application films 41 provided on the left and right. When magnetic anisotropy of the free layer 18 of the magneto-resistance effect device 10 is controlled by this bias magnetic field to form a single domain, the domain structure thereof can be stabilized so that Burkhausen noise caused by movement of a domain wall can be suppressed.

Because the S/N ratio of the magneto-resistance effect film 10 is improved, high-sensitive magnetic reproduction can be made when the magneto-resistance effect device 10 is applied to the magnetic head.

Fourth Embodiment

A magnetic recorder and a magnetic head assembly using a magneto-resistance effect device 10 according to this embodiment will be described below.

Figure 23:
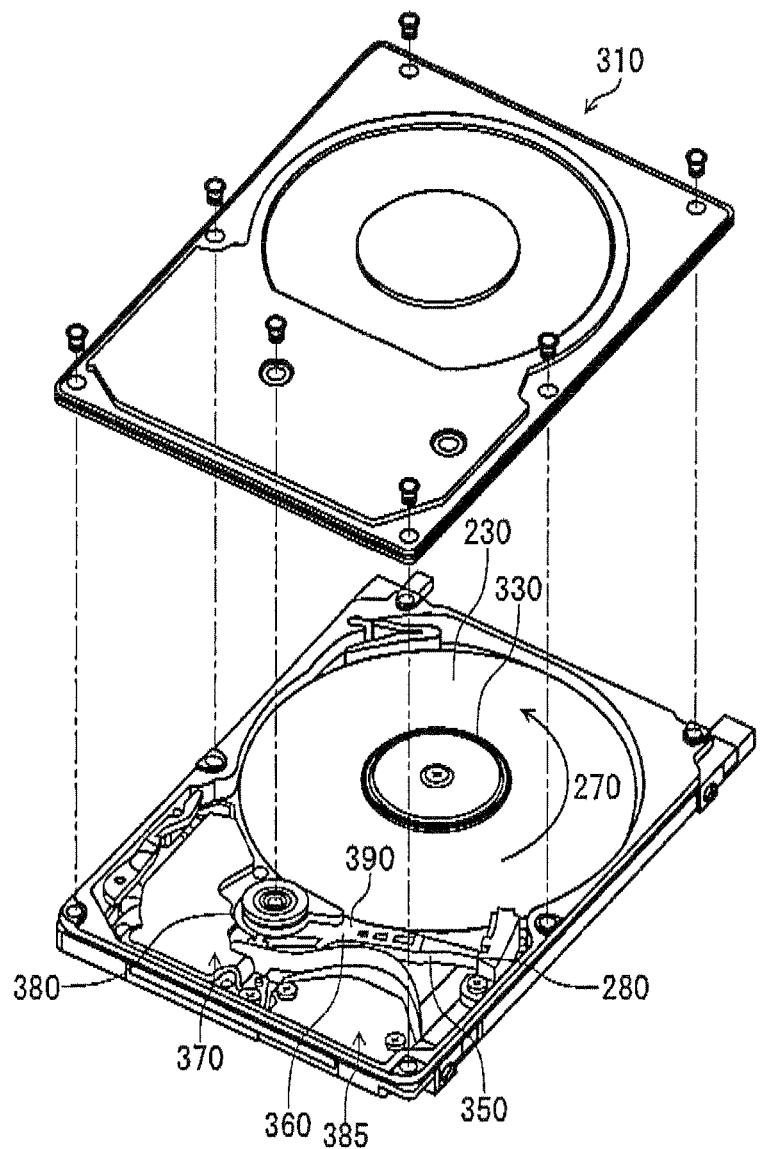
FIG. 23 is a view showing the configuration of a magnetic recorder according to a fourth embodiment.

FIG. 23 is a perspective view showing the magnetic recorder according to this embodiment.

As shown in FIG. 23, the magnetic recorder 310 according to this embodiment is an apparatus of the type using a rotary actuator. A magnetic recording medium 230 is provided on a spindle motor 330 so that the magnetic recording medium 230 is rotated in a direction of a medium moving direction 270 by a motor (not shown) responding to a control signal given from a drive control portion (not shown). The magnetic recorder 310 may be provided with a plurality of magnetic recording media 230.

Figure 24:
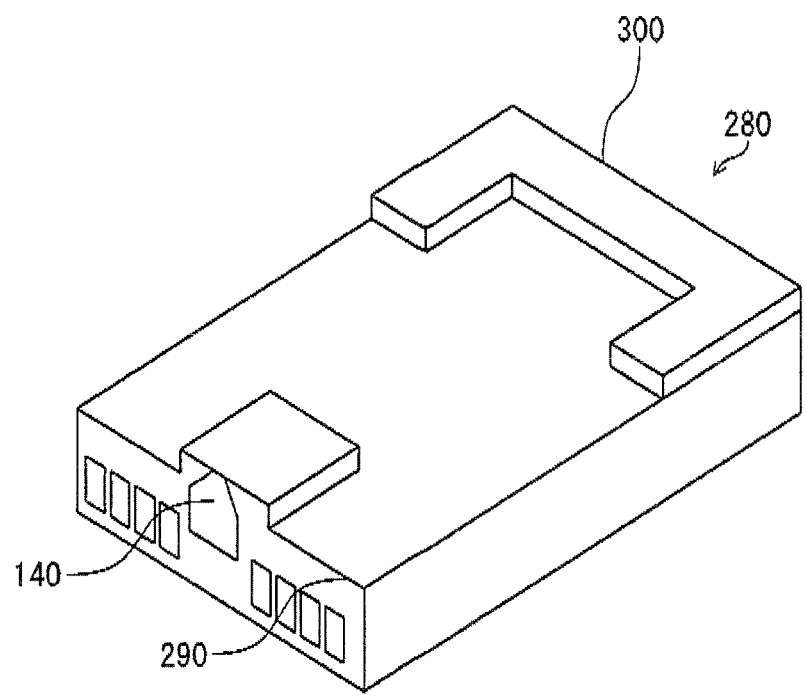
FIG. 24 is a view showing the configuration of a head slider.

As for each head slider 280 which performs recording and reproducing of information stored in the magnetic recording medium 230, a magnetic head 140 having a magneto-resistance effect device 10 is provided in the head slider 280, as shown in FIG. 24. The head slider 280 is made of $Al_2O_3$/TiC or the like, designed so that the head slider 280 can move relatively while floating up from the magnetic recording medium 230 such as a magnetic disk or being in contact with the magnetic recording medium 230, and having an air inflow side 290 and an air outflow side 300.

The head slider 280 is attached to a front end of a thin-film suspension 350. The head slider 280 is formed so that the magnetic head 140 is provided near a front end of the head slider 280.

When the magnetic recording medium 230 rotates, a pressure caused by each suspension 350 is balanced with a pressure generated in the medium facing surface (ABS) of each head slider 280. The medium facing surface of the head slider 280 is retained with a predetermined floating amount from a surface of the magnetic recording medium 230. There may be provided a "contact traveling type" in which the head slider 280 is in contact with the magnetic recording medium 230.

The suspension 350 is connected to one end of an actuator arm 360 having a bobbin portion, etc. for holding a driving coil (not shown). A voice coil motor 370 which is a kind of linear motor is provided at the other end of the actuator arm 360. The voice coil motor 370 may include a driving coil (not shown) wound up on the bobbin portion of the actuator arm 360, and a magnetic circuit having a permanent magnet and a counter yoke provided oppositely so that the driving coil is put therebetween.

The actuator arm 360 is retained by a ball bearing (not shown) provided in two places on upper and lower sides of a bearing portion 380 so that the actuator arm 360 can be slid and rotated freely by the voice coil motor 370. As a result, the magnetic head 140 can be moved to any position of the magnetic recording medium 230.

Figure 25A:
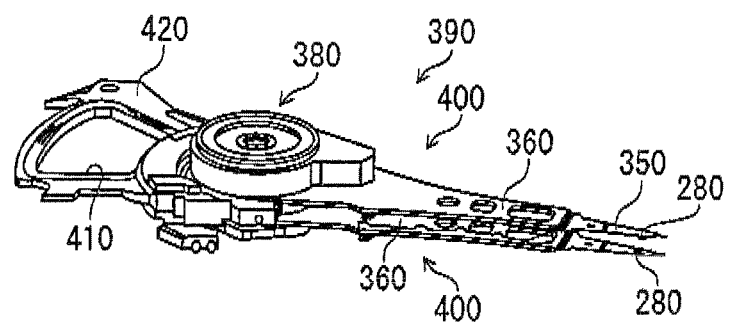
FIGS. 25A and 25B are views showing the configuration of a head stack assembly.

FIG. 25A shows a head stack assembly 390 which forms a part of the magnetic recorder 310 according to this embodiment.

Figure 25B:
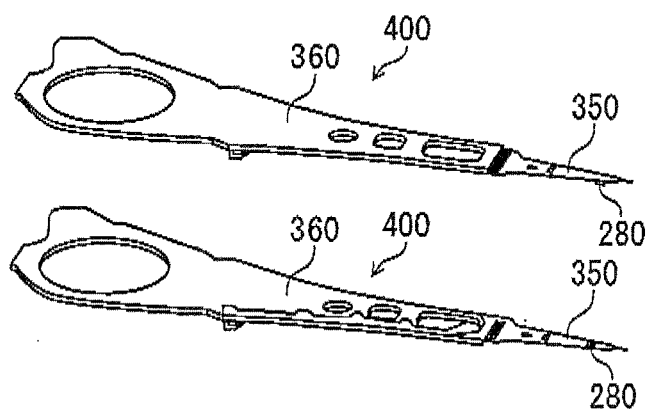

FIG. 25B is a perspective view showing magnetic head assemblies (head gimbal assemblies (HGA)) 400 which are a part of the head stack assembly 390.

As shown in FIG. 25A, the head stack assembly 390 has a bearing portion 380, the head gimbal assemblies 400 extending from the bearing portion 380, and a support frame 420 extending from the bearing portion 380 in a direction opposite to the head gimbal assemblies 400 and supporting a coil 410 of a voice coil motor.

As shown in FIG. 25B, each head gimbal assembly 400 has an actuator arm 360 extending from the bearing portion 380, and a suspension 350 extending from the actuator arm 360.

A head slider 280 having a magnetic recording head 140 as described in the second embodiment is provided at a front end of each suspension 350.

The magnetic head assembly (head gimbal assembly (HGA)) 400 according to this embodiment has a magnetic recording head 140 described in the second embodiment, a head slider 280 provided with the magnetic recording head 140, a suspension 350 having one end where the head slider 280 is mounted, and an actuator arm 360 connected to the other end of the suspension 350.

The suspension 350 has lead wires (not shown) for signal writing and reading, for heater for floating amount adjustment and for STO10. The lead wires are electrically connected to respective electrodes of the magnetic recording head 140 incorporated in the head slider 280. Electrode pads (not shown) are provided in the head gimbal assembly 400. In this embodiment, eight electrode pads are provided. Two electrode pads are provided for coil of main magnetic poles 200, two electrode pads are provided for a magnetic reproducing device 190, two electrode pads are provided for DFH (dynamic flying height), and two electrode pads are provided for STO10.

A signal processing port ion 385 is provided on the back (in the drawing) of the magnetic recorder 310 shown in FIG. 23. The signal processing port ion 385 per forms signal writing/reading into/from the magnetic recording medium 230 by using the magnetic recording-heads 140. Input/output lines of the signal processing port ion 385 are connected to the electrode pads of the head gimbal assemblies 400 and electrically connected to the magnetic recording heads 140.

The magnetic recorder 310 according to this embodiment has a magnetic recording medium 230, magnetic recording heads 140, a movable portion which can move relatively while making the magnetic recording medium 230 and each of the magnetic recording heads 140 be separated from each other or be in contact with each other in a state where the magnetic recording medium 230 and the magnetic recording head 140 confront each other, a position control portion which aligns the magnetic recording heads 140 with a predetermined recording position of the magnetic recording medium 230, and a signal processing portion 385 which performs writing/reading into/from the magnetic recording medium 230 by using the magnetic recording heads 140.

A magnetic recording medium 230 is used as the aforementioned magnetic recording medium 230. The aforementioned movable portion can include the head sliders 280. The aforementioned position control portion can include the head gimbal assemblies 400.

The magnetic recorder 310 has a magnetic recording medium 230, head gimbal assemblies 400, and a signal processing portion 385 which performs signal writing/reading into/from the magnetic recording medium 230 by using the magnetic recording heads 140 mounted in the head gimbal assemblies 400.

The magneto-resistance effect device according to the invention can be used also in all magneto-resistance effect devices, magnetic heads, magnetic recorders and magnetic memories which can be implemented with a design changed suitably by those skilled in the art based on the aforementioned magnetic heads and magnetic recorders according to the embodiments of the invention.

Although the bottom type magneto-resistance effect device 10 has been described in the embodiments of the invention, the effect of the invention can be obtained even in a top type magneto-resistance effect device 10 in which the pin layer 14 is formed above the spacer layer 16.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magneto-resistance effect device comprising:
   a multilayer structure comprising:
      a first magnetic layer;
      a second magnetic layer having a magnetization which is changeable;
      a spacer layer provided between the first magnetic layer and the second magnetic layer;
      a function layer formed inside the second magnetic layer, the function layer being a uniform oxide layer having mixed oxide containing Cd and at least one element selected from Fe, Co and Ni, wherein resistivity of the function layer is not higher than $5 \times 10^4$ $\mu\Omega$cm; and
   a pair of electrodes applying a current perpendicular to a film plane of the multilayer structure.

2. The device according to claim 1, wherein the mixed oxide contains Cd and Fe.

3. The device according to claim 1, wherein film thickness of the function layer is not smaller than 1 nm and not larger than 10 nm.

4. The device according to claim 1, wherein the product of a sectional area perpendicular to a stacking direction of the multilayer structure and resistance obtained from the pair of electrodes when a current is applied perpendicularly to the film plane of the multilayer structure is not larger than $1 \Omega \mu m^2$.

5. The device according to claim 1, wherein the function layer further contains at least one element selected from Al, B, Ga, C, Si, Ge and Sn.

6. The device according to claim 1, wherein the spacer layer contains any one of Cu, Au and Ag.

7. The device according to claim 1, wherein the first magnetic layer has a magnetization which is fixed.

8. A magnetic recorder comprising:
   a magnetic recording medium;
   a magnetic recording head comprising a magneto-resistance effect device comprising:
      a multilayer structure;
      a first magnetic layer;
      a second magnetic layer having a magnetization which is changeable;
      a spacer layer provided between the first magnetic layer and the second magnetic layer;
      a function layer formed inside the second magnetic layer, the function layer being a uniform oxide layer having mixed oxide containing Cd and at least one element selected from Fe, Co and Ni, wherein resistivity of the function layer is not higher than $5 \times 10^4$ $\mu\Omega$cm;
   a pair of electrodes applying a current perpendicular to a film plane of the multilayer structure; and a signal processing portion which performs signal writing/reading into/from the magnetic recording medium by using the magnetic recording head.

* * * * *